(12) United States Patent
Shao et al.

(10) Patent No.: US 12,309,997 B2
(45) Date of Patent: May 20, 2025

(54) SEMICONDUCTOR STRUCTURE AND METHOD FOR FABRICATING SAME

(71) Applicants: CHANGXIN MEMORY TECHNOLOGIES, INC., Hefei (CN); Beijing Superstring Academy of Memory Technology, Beijing (CN)

(72) Inventors: Guangsu Shao, Hefei (CN); Deyuan Xiao, Hefei (CN); Weiping Bai, Hefei (CN); Yunsong Qiu, Hefei (CN)

(73) Assignees: CHANGXIN MEMORY TECHNOLOGIES, INC., Hefei (CN); Beijing Superstring Academy of Memory Technology, Beijing (CN)

( * ) Notice: Subject to any disclaimer, the term of this patent is extended or adjusted under 35 U.S.C. 154(b) by 488 days.

(21) Appl. No.: 17/878,061

(22) Filed: Aug. 1, 2022

(65) Prior Publication Data
US 2023/0049171 A1    Feb. 16, 2023

(30) Foreign Application Priority Data

Aug. 16, 2021   (CN) .......................... 202110937532.8

(51) Int. Cl.
*H10B 12/00*     (2023.01)

(52) U.S. Cl.
CPC .......... *H10B 12/05* (2023.02); *H10B 12/315* (2023.02); *H10B 12/482* (2023.02)

(58) Field of Classification Search
None
See application file for complete search history.

(56) References Cited

U.S. PATENT DOCUMENTS

| 7,732,872 | B2 | 6/2010 | Cheng et al. | |
| 2021/0375874 | A1* | 12/2021 | Doornbos | H10N 70/011 |
| 2023/0049171 | A1* | 2/2023 | Shao | H10B 12/482 |
| 2023/0170416 | A1* | 6/2023 | Xiao | H10B 12/488 |
| | | | | 257/329 |

* cited by examiner

*Primary Examiner* — Steven M Page
(74) *Attorney, Agent, or Firm* — Kilpatrick Townsend & Stockton LLP

(57) ABSTRACT

Embodiments provide a semiconductor structure and a fabrication method thereof. The fabrication method includes: providing a substrate including a plurality of semiconductor layers arranged at intervals and an isolation layer positioned between adjacent two of the plurality of semiconductor layers, a given one of the plurality of semiconductor layers and the isolation layer being internally provided with trenches, and each of the trenches including a first region, a second region and a third region sequentially distributed; forming a sacrificial layer on an inner wall of the trench in the first region and the second region; forming an insulating layer filling up the trench on a surface of the sacrificial layer; removing the sacrificial layer in the second region, and removing the isolation layer of a first thickness to form voids surrounding the given semiconductor layer.

12 Claims, 26 Drawing Sheets

SEMICONDUCTOR STRUCTURE AND METHOD FOR FABRICATING SAME

CROSS-REFERENCE TO RELATED APPLICATION

This application claims priority to Chinese Patent Application No. 202110937532.8, titled "SEMICONDUCTOR STRUCTURE AND METHOD FOR FABRICATING SAME" and filed to the State Patent Intellectual Property Office on Aug. 16, 2021, the entire contents of which are incorporated herein by reference.

TECHNICAL FIELD

Embodiments of the present disclosure relate to the field of semiconductors, and more particularly, to a semiconductor structure and a fabrication method thereof.

BACKGROUND

As dynamic memories develop towards a higher direction of integration density, it is also required to improve electrical properties of small-size functional devices while studying arrangement of transistors in a dynamic memory array structure and how to reduce sizes of a single functional device in the dynamic memory array structure.

When a vertical gate-all-around (GAA) transistor structure is used as a dynamic memory access transistor, an area occupied by the transistor may reach 4F2 (F: a minimum pattern size that may be obtained under given process conditions), such that higher density efficiency may be achieved in principle. However, due to reduction of a spacing between a gate electrode layer and a semiconductor layer, adverse impacts of gate-induced drain leakage (GIDL) on the electrical properties of the semiconductor structure increases.

SUMMARY

Embodiments of the present disclosure provide a semiconductor structure and a fabrication method thereof, which are at least beneficial for reducing a drain leakage current of the semiconductor structure.

According to some embodiments of the present disclosure, one aspect of the embodiments of the present disclosure provides a method for fabricating a semiconductor structure, including: providing a substrate, the substrate comprising a plurality of semiconductor layers arranged at intervals and an isolation layer positioned between adjacent two of the plurality of semiconductor layers, a given one of the plurality of semiconductor layers and the isolation layer being internally provided with trenches, the plurality of semiconductor layers being respectively distributed in sequence along a first direction and a second direction, the trenches extending in the second direction and being arranged at intervals in the first direction, the second direction being different from the first direction, and each of the trenches comprising a first region, a second region and a third region sequentially distributed in a direction directing from a bottom of the trench to a top of the trench; forming a sacrificial layer on an inner wall of the trench in the first region and the second region; forming an insulating layer filling up the trench on a surface of the sacrificial layer, the insulating layer also exposing at least a portion of a surface of the isolation layer; removing the sacrificial layer in the second region, and removing the isolation layer of a first thickness to form voids surrounding the given semiconductor layer, the voids exposing a portion of a side wall of the given semiconductor layer; forming a gate dielectric layer on the exposed side wall of the given semiconductor layer; forming a first gate electrode layer on a portion of the gate dielectric layer, the first gate electrode layer being also positioned on a top surface of a remaining portion of the isolation layer; and forming a second gate electrode layer on a remaining portion of the gate dielectric layer, a work function value of the second gate electrode layer being different from a work function value of the first gate electrode layer, and the first gate electrode layer and the second gate electrode layer being stacked in a direction directing from the first region to the third region.

In addition, the forming the sacrificial layer and the insulating layer comprises: forming a sacrificial film, the sacrificial film being positioned on an entire inner wall of the trench; forming a first insulating layer filling up the trench on the sacrificial film; removing the sacrificial film positioned on the inner wall of the trench in the third region, a remaining portion of the sacrificial film being used as the sacrificial layer; and forming a second insulating layer on the inner wall of the trench in the third region, the second insulating layer being further positioned on a side wall of the first insulating layer, and the second insulating layer and the first insulating layer being used as the insulating layer.

In addition, the isolation layer of a second thickness is further removed while the sacrificial film on the inner wall of the trench in the third region is removed, and a remaining portion of the isolation layer exposes a portion of the side wall of the given semiconductor layer; and in the formation of the second insulating layer, the second insulating layer is further positioned on the side wall of the given semiconductor layer exposed by the remaining portion of the isolation layer.

In addition, the sacrificial film on the inner wall of the trench in the third region is etched and removed by means of a wet etching process, and the wet etching process has an equal etching rate for the isolation layer and the sacrificial film.

In addition, the forming the second insulating layer comprises: forming an insulating film, the insulating film filling up a region between the inner wall of the trench in the third region and the first insulating layer, the insulating film being positioned on a top surface of the remaining portion of the isolation layer and the exposed side wall of the given semiconductor layer, and the insulating film being further positioned on the top surface of the given semiconductor layer; and etching back the insulating film to remove the insulating film above the top surface of the given semiconductor layer and further remove at least a portion of the insulating film on the top surface of the isolation layer, a remaining portion of the insulating film being used as the second insulating layer.

In addition, the forming the sacrificial layer comprises: forming a sacrificial film, the sacrificial film covering an entire inner wall of the trench and being further positioned on a top surface of the given semiconductor layer; and etching back the sacrificial film, and etching to remove the sacrificial film positioned at a bottom of the trench, the top surface of the given semiconductor layer, and the inner wall of the trench in the third region, a remaining portion of the sacrificial film being used as the sacrificial layer.

In addition, during the etching back the sacrificial film, the isolation layer of a second thickness is further removed, and an opening is defined between adjacent two of the plurality of semiconductor layers and the remaining portion of the isolation layer. The forming the insulating layer comprises: forming an insulating film filling up the trench on the sacrificial layer, the insulating film further filling up the opening; and removing at least a portion of the insulating film positioned in the opening to expose at least a portion of the top surface of the remaining portion of the isolation layer, the remaining portion of the insulating film and the first insulating layer being used as the insulating layer.

In addition, the etching back the sacrificial film further comprises: removing the sacrificial layer in the second region. The forming a gate dielectric layer comprises: forming a dielectric layer at least on the inner wall of the trench in the second region and the third region, where the dielectric layer on the inner wall of the trench in the second region is used as the gate dielectric layer.

In addition, before the insulating layer is formed, the fabrication method further comprises: performing first metallization treatment on a given one of the plurality of semiconductor layers below the bottom of the trench, to convert the given semiconductor layer of a portion of thicknesses into a bit line, the bit line extending in the first direction, and a material of the bit line being a metal semiconductor compound.

In addition, the forming the sacrificial layer comprises: forming a sacrificial film on all inner walls of the trench; and the first metallization treatment comprises: forming a metal layer on a surface of the sacrificial film, the metal layer being further positioned at the bottom of the trench; performing annealing treatment such that the metal layer reacts with the given semiconductor layer to form the bit line; and removing a remaining portion of the unreacted metal layer.

In addition, the fabrication method further includes: after the sacrificial layer is formed, performing second metallization treatment on a given one of the plurality of semiconductor layers above a top surface of the second gate electrode layer, to form a metal silicide layer.

In addition, the first metallization treatment and the second metallization treatment are performed in a same process step.

According to some embodiments of the present disclosure, another aspect of the embodiments of the present disclosure further provides a semiconductor structure, which includes: a substrate; a sacrificial layer; a gate dielectric layer, a first gate electrode layer, and a second gate electrode layer; and an insulating layer. The substrate includes a plurality of semiconductor layers arranged at intervals and an isolation layer positioned between adjacent two of the plurality of semiconductor layers, a given one of the plurality of semiconductor layers and the isolation layer are internally provided with trenches, the plurality of semiconductor layers extend in a first direction, and the trenches extend in a second direction, where the second direction is different from the first direction. Each of the trenches includes a first region, a second region and a third region sequentially distributed in a direction directing from a bottom of the trench to a top of the trench. The sacrificial layer is positioned on an inner wall of the trench in the first region. The first gate electrode layer and the second gate electrode layer are both positioned on the gate dielectric layer, and are positioned in the trench in the second region and surround the given semiconductor layer. The first gate electrode layer is further positioned on a top surface of the isolation layer, the second gate electrode layer and the first gate electrode layer are stacked in a direction directing from the first region to the third region, and a work function value of the second gate electrode layer is different from a work function value of the first gate electrode layer. The insulating layer is positioned in the trench, the insulating layer is configured to isolate opposite two of the gate electrode layers positioned in the same trench, and the insulating layer is also positioned in the trench filling up the third region.

In addition, a top surface of the isolation layer directly below the first gate electrode layer is flush with a top surface of the sacrificial layer.

In addition, the semiconductor structure further includes: a bit line extending in the first direction, where the bit line is positioned at the bottom of the trench and directly below a bottom of an adjacent trench, and a material of the bit line is a metal semiconductor compound.

The technical solutions provided by the embodiments of the present disclosure at least have the following advantages.

In the above technical solutions, in a direction directing from a first region to a third region, a first gate electrode layer and a second gate electrode layer are sequentially stacked on a gate dielectric layer, and a work function value of the second gate electrode layer is different from that of the first gate electrode layer. In this way, it is beneficial to reduce a work function value of a gate electrode layer that comprises the first gate electrode layer and the second gate electrode layer by adjusting the work function value of the second gate electrode layer and the work function value of the first gate electrode layer, as well as a size ratio of the first gate electrode layer with respect to the second gate electrode layer, to reduce a difference between the work function value of the gate electrode layer and a work function value of a semiconductor layer. In one aspect, it is beneficial to reduce a lateral electric field at a corresponding part of the gate electrode layer and the semiconductor layer, and reduce gate-induced drain leakage (GIDL), thereby helping to increase a turn-on/turn-off ratio of a channel region, to improve sensitivity of controlling the turn-on/turn-off of the channel region. In another aspect, it is beneficial to enable the gate electrode layer to be suitable for different types of transistors while lowering a threshold voltage of the transistor, thereby helping to reduce fabrication processes and fabrication costs of the semiconductor structure.

In addition, a vertical GAA transistor is formed on a substrate, and a bit line is positioned between the substrate and the GAA transistor, such that a 3D stacked semiconductor structure may be formed, which is beneficial to increase the integration density of the semiconductor structure. Moreover, by forming voids, the gate dielectric layer and the gate electrode layer are sequentially formed on a side wall of the semiconductor layer exposed by the voids, which facilitates forming the gate dielectric layer and the gate electrode layer having precise sizes in the voids by means of self-alignment, and simplifying the formation of the gate dielectric layer and the gate electrode layer. Moreover, by adjusting the sizes of the voids, the gate dielectric layer and the gate electrode layer having a small size may be obtained.

BRIEF DESCRIPTION OF THE DRAWINGS

Exemplary descriptions are made to one or more embodiments with reference to pictures in the corresponding drawings, and these exemplary descriptions do not constitute limitations on the embodiments, and elements with the same reference numerals in the drawings are denoted as similar elements. Unless otherwise stated, the figures in the accompanying drawings do not constitute a scale limitation.

DETAILED DESCRIPTION

Figure 1:
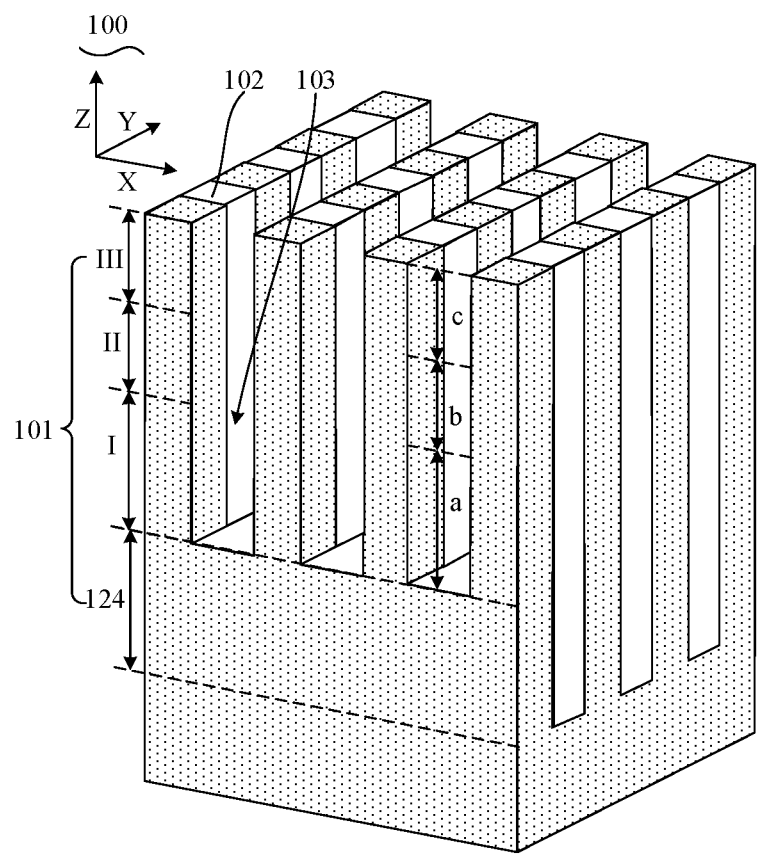
FIGS. 1 to 42 are schematic structural diagrams corresponding to steps of a method for fabricating a semiconductor structure according to an embodiment of the present disclosure.

It can be known from the background art that drain leakage current of the currently formed semiconductor structure needs to be reduced, and electrical properties of the semiconductor structure need to be improved.

After analysis, it is found that in a Gate-All-Around (GAA) transistor of the semiconductor structure, to improve conductivity of a source, a drain and the channel region, the semiconductor layer including the source, the drain and the channel region may be doped, and concentrations of doped ions in the source, the drain and the channel region are higher, such that the lateral electric field at the corresponding part of the gate electrode layer and the semiconductor layer is increased, gate-induced drain leakage (GIDL) is enhanced, and turn-on/turn-off ratio of the channel region is reduced, making it difficult for the gate electrode layer to control turn-off of the channel region, thereby reducing electrical properties of the semiconductor structure. In addition, a threshold voltage of the transistor is mainly determined by the difference between the work function value of the gate electrode layer and the work function value of the semiconductor layer. Because semiconductor layers of different types of transistors (such as p-channel metal oxide semiconductor PMOS or n-channel metal oxide semiconductor NMOS) have different work function values, to reduce the difference between the work function value of the gate electrode layer and the work function value of the semiconductor layer to reduce the threshold voltage of the transistor, it is required to configure gate electrode layers made of different materials for different transistors, which increases processes and costs for fabricating the semiconductor structure.

Embodiments of the present disclosure provide a semiconductor structure and a fabrication method thereof. In the fabrication method, a first gate electrode layer and a second gate electrode layer having different work function values are sequentially stacked on the gate dielectric layer, where the first gate electrode layer and the second gate electrode layer jointly constitute the gate electrode layer. In this way, it is beneficial to reduce the difference between the work function value of the gate electrode layer and the work function value of the semiconductor layer by adjusting related parameters of the first gate electrode layer and the second gate electrode layer and reducing the work function value of the gate electrode layer. In one aspect, it is beneficial to reduce the lateral electric field at the corresponding part of the gate electrode layer and the semiconductor layer, and reduce the GIDL, thereby helping to increase the turn-on/turn-off ratio of the channel region, to improve the sensitivity of controlling the turn-on/turn-off of the channel region. In another aspect, it is beneficial to enable the gate electrode layer to be suitable for different types of transistors by adjusting related parameters of the first gate electrode layer and the second gate electrode layer while lowering the threshold voltage of the transistor, thereby helping to reduce the fabrication processes and fabrication costs of the semiconductor structure.

To make the objectives, technical solutions and advantages of the embodiments of the present disclosure more clear, the embodiments of the present disclosure will be described in detail below with reference to the accompanying drawings. However, a person of ordinary skill in the art may understand that in each embodiment of the present disclosure, many technical details are put forward such that a reader may better understand the present disclosure. However, the technical solutions requested to be protected by the present disclosure may also be implemented even without these technical details or various variations and modifications based on the following embodiments.

An embodiment of the present disclosure provides a method for fabricating a semiconductor structure, and the method for fabricating a semiconductor structure provided by this embodiment of the present disclosure will be described in detail below with reference to the accompanying drawings. FIGS. 1 to 42 are schematic structural diagrams corresponding to steps of a method for fabricating a semiconductor structure according to an embodiment of the present disclosure. It should be noted that to facilitate the description and clearly illustrate the steps of the method for fabricating a semiconductor structure, FIGS. 1 to 42 in this embodiment are all partial schematic structural diagrams of the semiconductor structure.

Figure 2:
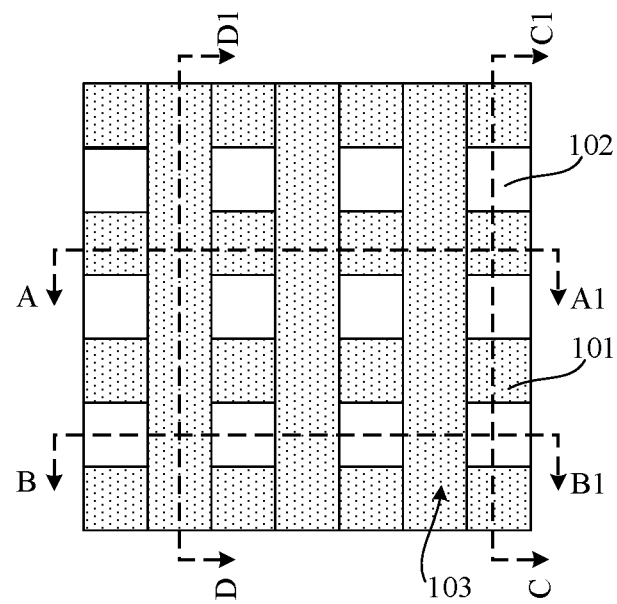
Figure 6:
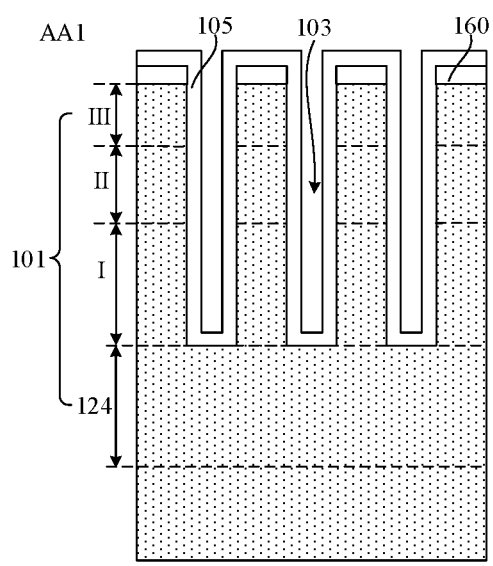
Figure 7:
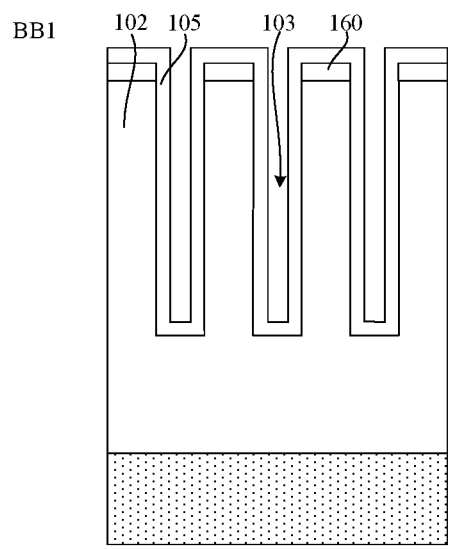
Figure 8:
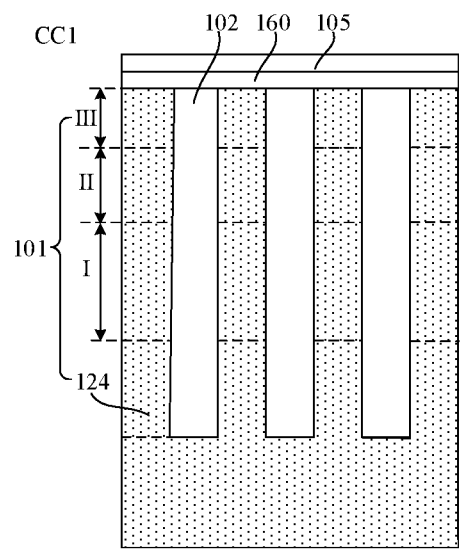
Figure 9:
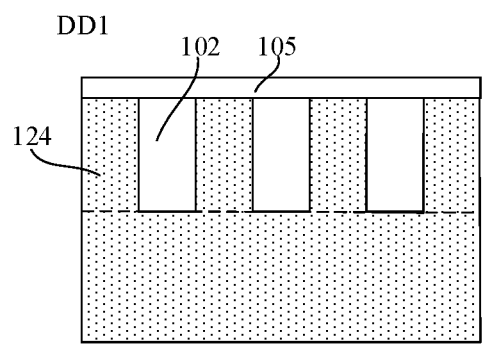

FIG. 2 is a top view of the structure shown in FIG. 1, FIG. 6 is a schematic cross-sectional view in a first cross-sectional direction AA1 after a first protective layer and an initial sacrificial film are formed on the basis of FIG. 2; FIG. 7 is a schematic cross-sectional view in a second cross-sectional direction BB1 after the first protective layer and the initial sacrificial film are formed on the basis of FIG. 2; FIG. 8 is a schematic cross-sectional view in a third cross-sectional direction CC1 after the first protective layer and the initial sacrificial film are formed on the basis of FIG. 2. FIG. 9 is a schematic cross-sectional view in a fourth cross-sectional direction DD1 after the first protective layer and the initial sacrificial film are formed on the basis of FIG. 2. It should be noted that one, two, three or four of the schematic cross-sectional view in the first cross-sectional direction AA1, the schematic cross-sectional view in the second cross-sectional direction BB1, the schematic cross-sectional view in the third cross-sectional direction CC1, and the schematic cross-sectional view in the fourth cross-sectional direction DD1 will be provided later as needed.

Referring to FIG. 1 and FIG. 2, a substrate 100 is provided, where the substrate 100 includes a plurality of semiconductor layers 101 arranged at intervals and an isolation layer 102 positioned between adjacent two of the plurality of semiconductor layers 101. A given one of the plurality of semiconductor layers 101 and the isolation layer 102 are internally provided with trenches 103, the plurality of semiconductor layers 101 extend in a first direction X, the trenches 103 extend in a second direction Y, and the trenches 103 are arranged at intervals in the first direction X, where second direction Y is different from the first direction X. Each of the trenches 103 includes a first region a, a second region b and a third region c sequentially distributed in a direction Z directing from a bottom of the trench 103 to a top of the trench 103.

In the direction Z directing from the bottom of the trench 103 to the top of the trench 103, a semiconductor layer 101 includes an initial bit line 124, a first doped region I, a channel region II, and a second doped region III arranged in sequence. It should be noted that both the first doped region I and the second doped region III may be used as a source or drain of a subsequently formed GAA transistor having the semiconductor layer 101, the channel region II corresponds to a gate electrode layer of the GAA transistor, and the initial bit line 124 prepares for the subsequent formation of the bit line. In addition, the first region a of the trench 103 corresponds to the first doped region I of the semiconductor layer 101, the second region b of the trench 103 corresponds to the channel region II of the semiconductor layer 101, and the third region c of the trench 103 corresponds to the second doped region III of the semiconductor layer 101. That is, when a plane formed by the direction Y and the direction Z is set as a first plane, an orthographic projection of the first region a on the first plane covers an orthographic projection of the first doped region I on the first plane. In the direction Z, a height of the orthographic projection of the first region a on the first plane is equal to a height of the orthographic projection of the first doped region I on the first plane, and both a relationship between orthographic projections of the second region b and the channel region II on the first plane and a relationship between orthographic projections of the third region c and the second doped region III on the first plane are the same as a relationship between the orthographic projections of the first region a and the first doped region I on the first plane, and thus details are not described herein again.

In some embodiments, providing a substrate 100 includes following steps.

Figure 3:
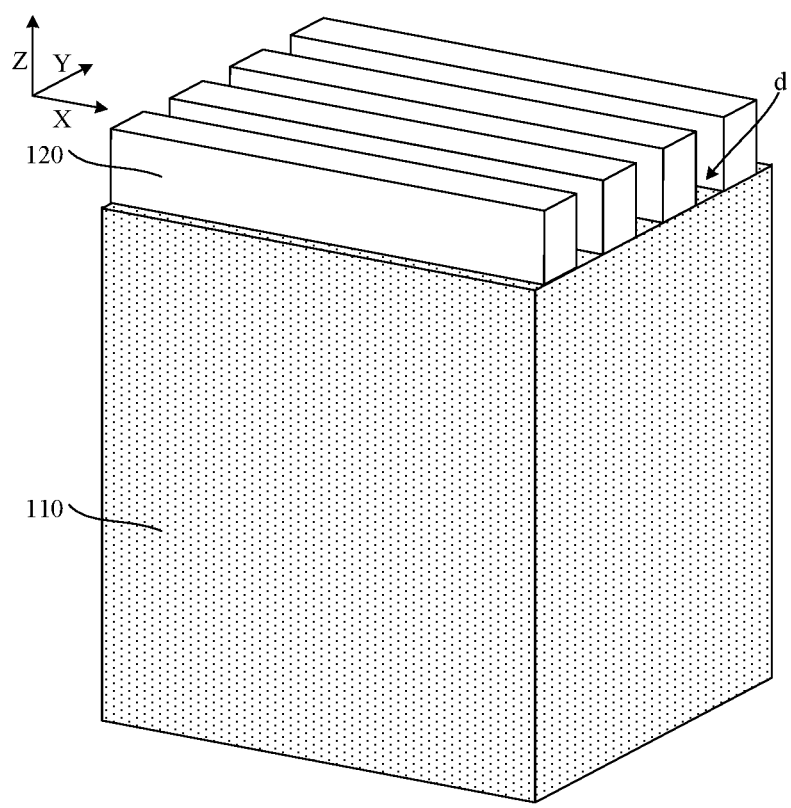

Referring to FIG. 3, an initial substrate 110 is provided. In some embodiments, a material type of the initial substrate 110 may be an elemental semiconductor material or a crystalline inorganic compound semiconductor material. The elemental semiconductor material may be silicon or germanium; and the crystalline inorganic compound semiconductor material may be silicon carbide, silicon germanium, gallium arsenide, or indium gallium, etc.

The initial substrate 110 is subjected to doping treatment and annealing treatment, such that the initial substrate 110 is doped with N-type ions or P-type ions, for subsequent formation of a bit line and a semiconductor layer on the basis of the initial substrate 110. In some embodiments, the N-type ions may be at least one of arsenic ions, phosphorus ions, or antimony ions; and the P-type ions may be at least one of boron ions, indium ions, or gallium ions. For example, a doping concentration of the doped ions in the initial substrate 110 may be $1 \times 10^{19}$ atoms/cm$^3$ to $1 \times 10^{20}$ atoms/cm$^3$, and a doping depth of the doped ions in the initial substrate 110 may be 150 nm to 250 nm.

Still referring to FIG. 3, a first mask layer 120 is formed on the initial substrate 110, the first mask layer 120 has a plurality of mutually discrete first openings d extending in the first direction X, and a length of a given one of the plurality of first openings d is consistent with a length of a subsequently formed bit line.

Figure 4:
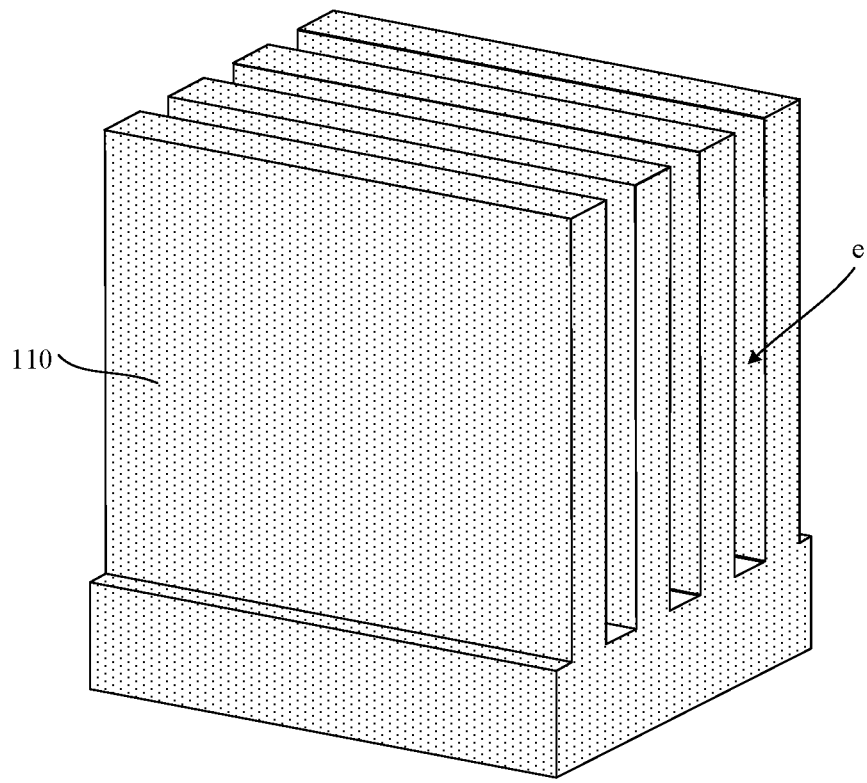

Referring to FIG. 3 and FIG. 4, the initial substrate 110 is etched by using the first mask layer 120 as a mask to form a plurality of first trenches e, and the first mask layer 120 is removed. In some embodiments, in the direction Z perpendicular to a surface of the substrate 100, a depth of a given one of the plurality of first trenches e may be 250-300 nm. The doping depth of the doped ions in the initial substrate 110 in a direction directing from the first mask layer 120 to the initial substrate 110 may be 150 nm to 250 nm. Because the depth of the given first trench e is greater than the doping depth of the doped ions in the initial substrate 110, it is beneficial to ensure that the initial substrate 110 doped with the doped ions is etched, and it is convenient to subsequently form a semiconductor layer and a bit line having a higher doping concentration of the doped ions.

Figure 5:
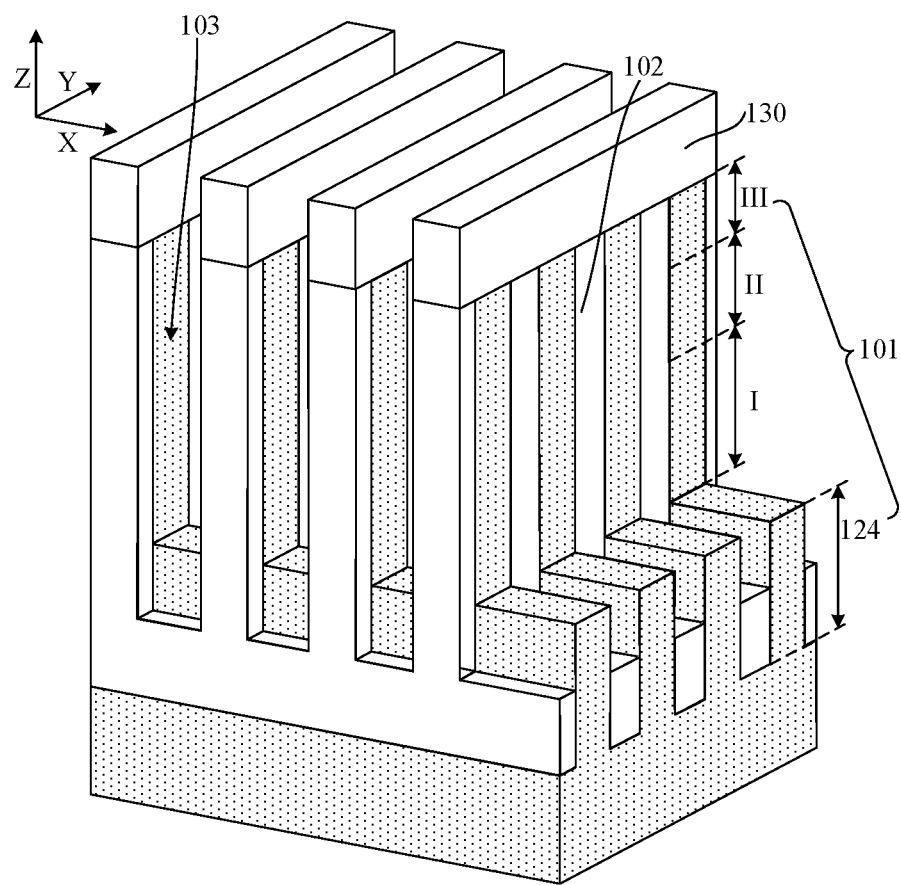

Referring to FIG. 4 and FIG. 5, a deposition process is performed to form an isolation film covering a top surface of the initial substrate 110 and filling up the given first trench e. Next, chemical mechanical planarization is performed on the isolation film to expose the top surface of the initial substrate 110. Next, a second mask layer 130 is formed on a top surface formed by the isolation film and a remaining portion of the initial substrate 110, where the second mask layer 130 has a plurality of mutually discrete second openings extending in the second direction Y, and a length of a given one of the plurality of second openings is consistent with a length of a subsequently formed gate electrode layer.

In some embodiments, referring to FIGS. 3 to 5, the first direction X is perpendicular to the second direction Y, such that the formed semiconductor layer 101 presents an arrangement of 4F2 (F: a minimum pattern size that may be obtained under given process conditions), which is beneficial to increase the integration density of the semiconductor structure. In other embodiments, the first direction intersects with the second direction, and an angle between the first direction and the second direction may not be 90°.

Referring to FIG. 5 and FIG. 1, the initial substrate 110 (referring to FIG. 4) and the isolation film are etched by using the second mask layer 130 as a mask to form the substrate 100. The substrate 100 includes a plurality of trenches 103, a plurality of semiconductor layers 101, and a plurality of isolation layers 102, where a given one of the plurality of semiconductor layers 101 includes an initial bit line 124, a first doped region I, a channel region II, and a second doped region III arranged in sequence, and the first doped region I, the channel region II and the second doped region III constitute a semiconductor channel. In the direction Z perpendicular to the surface of the substrate 100, a depth of the given one of the plurality of trenches 103 is less than a depth of the given first trench e (referring to FIG. 4), which is conducive to formation of the initial bit line 124 and a plurality of mutually discrete semiconductor channels on a side of the initial bit line 124, and the initial bit line 124 is in contact with the first doped region I of a given one of the plurality of semiconductor channels. Next, the second mask layer 130 is removed.

To achieve electrical insulation between adjacent two of the initial bit lines 124 and adjacent two of the plurality of semiconductor channels, after the initial substrate 110 and the isolation film are etched by using the second mask layer 130 as a mask, a remaining portion of the isolation film is still positioned in a spacing between adjacent two of the initial bit lines 124 and a spacing between adjacent two of the plurality of semiconductor channels.

A method for forming the initial bit lines 124, the plurality of semiconductor channels and the plurality of isolation layers 102 includes self-aligned quadruple patterning (SAQP) or self-aligned double patterning (SADP).

In some embodiments, the depth of the given trench 103 is 100 nm to 150 nm. Because the doping depth of the doped ions in the initial substrate 110 (referring to FIG. 4) is 150 nm to 250 nm, it is beneficial to allow the initial substrate 110, which is mostly or entirely doped with the doped ions, to be transformed into the given semiconductor channel by means of twice etching. In addition, in some embodiments, referring to FIG. 5, a material of the initial substrate 110 is silicon, and a material of the isolation film is silicon oxide.

In the step of etching the initial substrate 110 and the isolation film by using the second mask layer 130 as a mask, an etching rate of an etching process for silicon oxide is greater than that for silicon, such that a portion of a side wall of the initial bit line 124 may be exposed. In other embodiments, in the step of etching the initial substrate and the isolation film by using the second mask layer as a mask, the etching rate of etching the initial substrate may be equal to the etching rate of the isolation layer, such that side walls of the initial bit line are surrounded by the given isolation layer.

It should be noted that a plurality of initial bit lines 124 arranged at intervals may be formed on the initial substrate 110, and each of the plurality of initial bit lines 124 may be in contact with at least one first doped region I. In FIG. 5, by taking each of four of the plurality of initial bit lines 124 arranged at intervals in contact with four first doped regions I as an example, in practical applications, number of the initial bit lines 124 and number of the first doped regions I in contact with each of the four initial bit lines 124 may be reasonably set according to actual electrical requirements.

In addition, a device formed by the given semiconductor channel is a junctionless transistor. That is, the doped ions in the first doped region I, the channel region II, and the second doped region III are of the same type. For example, the doped ions are all N-type ions, and the doped ions in the first doped region I, the channel region II and the second doped region III may be the same. "Junctionless" herein refers to no PN junction. That is, there is no PN junction in a transistor formed by the semiconductor layer 101. That is, the doping concentrations of the doped ions in the first doped region I, the channel region II and the second doped region III are the same, and advantages are as below. In one aspect, there is no need to perform additional doping on the first doped region I and the second doped region III, thereby avoiding a problem that the doping process for the first doped region I and the second doped region III is difficult to control, especially as a transistor size is further reduced, if the first doped region I and the second doped region III are additionally doped, the doping concentration will be more difficult to control. In another aspect, the device is a junctionless transistor, it is beneficial to avoid a phenomenon of using an ultra-steep source-drain concentration gradient doping process to fabricate an ultra-steep PN junctions in a nano-scale range, and therefore problems such as threshold voltage drift and increase of leakage current caused by doping mutations may be avoided, it is also beneficial to suppress a short channel effect, and it can still work in the scale of several nanometers, thus helping to further improve the integration density and electrical properties of the semiconductor structure. It is to be understood that the additional doping herein refers to the doping performed to ensure the types of the doped ions in the first doped region I and the second doped region III are different from the type of the doped ions in the channel region II.

In some embodiments, forming a GAA transistor with a semiconductor channel perpendicular to the top surface of the given initial bit line 124 may form a 3D stacked semiconductor structure, which is beneficial to design a GAA transistor having smaller feature sizes, without adversely affecting the electrical properties of the GAA transistor, to increase the integration density of semiconductor structure.

In this embodiment, the first mask layer 120 and the second mask layer 130 are employed to simultaneously form the given initial bit line 124 and the given semiconductor layer 101 by means of twice etching processes. In one aspect, it is beneficial to adjust the size of the given semiconductor layer 101 by adjusting the size of the first opening d and the size of the second opening, and to form the given semiconductor layer 101 with higher size accuracy. In another aspect, the given initial bit line 124 and the given semiconductor layer 101 are both formed by etching the initial substrate 110. That is, the given initial bit line 124 and the given semiconductor layer 101 are formed by using the same film layer structure, such that the given initial bit line 124 and the given semiconductor layer 101 are of integrated structure, thereby improving an interface state defect between the given initial bit line 124 and the given semiconductor layer 101, and improving performance of the semiconductor structure.

Referring to FIG. 2 and FIG. 6 to FIG. 33, a sacrificial layer 125 is formed on the inner wall of the given trench 103 in the first region a and the second region b. an insulating layer 126 filling up the given trench 103 is formed on a surface of the sacrificial layer 125, and the insulating layer 126 exposes at least a portion of a surface of the isolation layer 102.

The forming the sacrificial layer 125 and the insulating layer 126 includes following process steps.

Referring to FIG. 6 to FIG. 16, a sacrificial film 115 is formed, where the sacrificial film 115 is positioned on an entire inner wall of the given trench 103.

In some embodiments, before the sacrificial film is formed, referring to FIG. 6 to FIG. 9, a first protective layer 160 is separately formed on a top surface of the given semiconductor layer 101 away from the given initial bit line 124 and a top surface of the isolation layer 102 away from the given initial bit line 124, where the first protective layer 160 is configured to protect the second doped region III to prevent the second doped region III from being metallized when the given initial bit line 124 is subsequently subjected to first metallization treatment. A material of the first protective layer 160 may be silicon oxide, silicon oxynitride, or silicon nitride.

Still referring to FIG. 6 to FIG. 9, an initial sacrificial film 105 is formed, where the initial sacrificial film 105 not only is positioned on the entire inner wall of the given trench 103, but also is positioned on an exposed surface of the first protective layer 160 and a bottom surface of the given trench 103.

Figure 10:
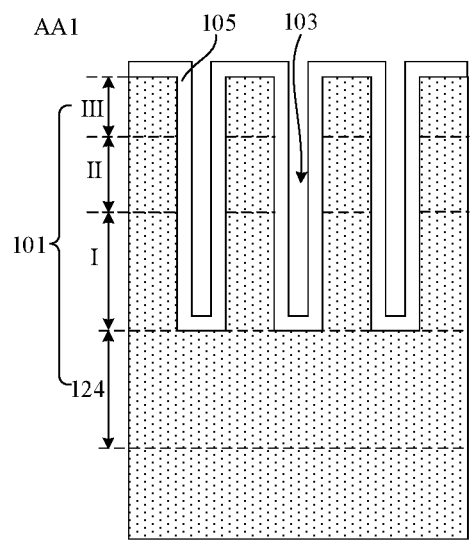
Figure 11:
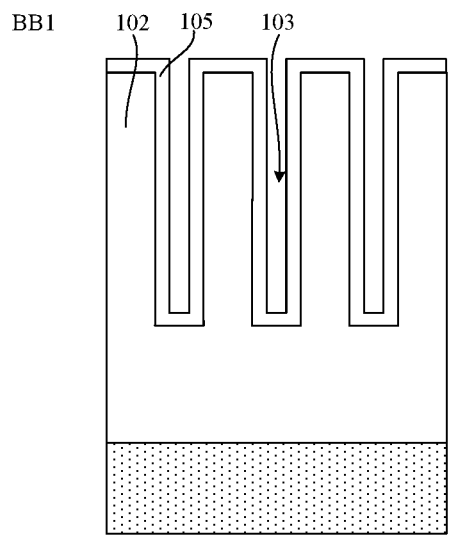
Figure 12:
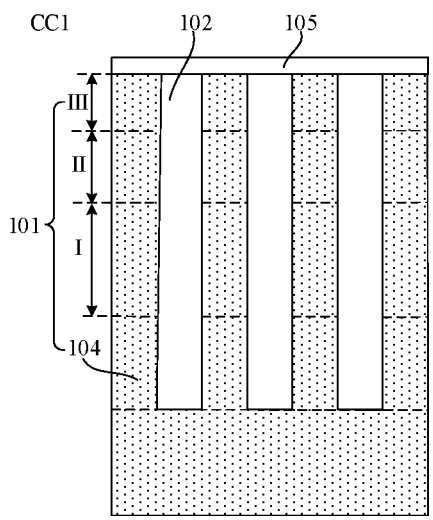
Figure 13:
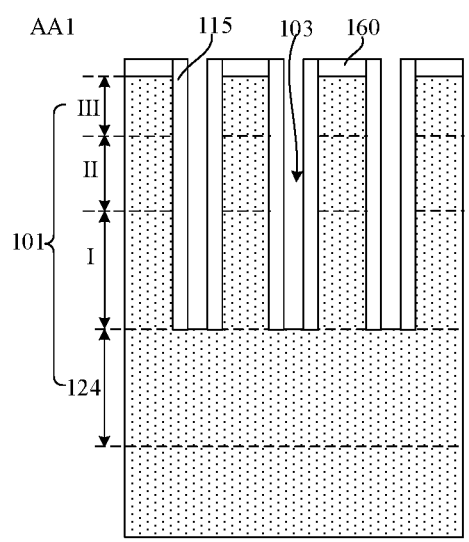
Figure 14:
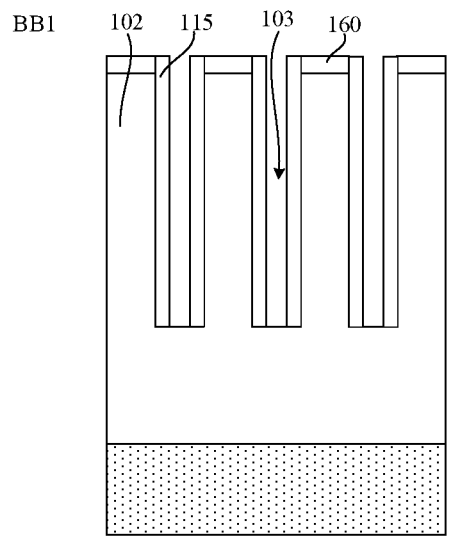
Figure 15:
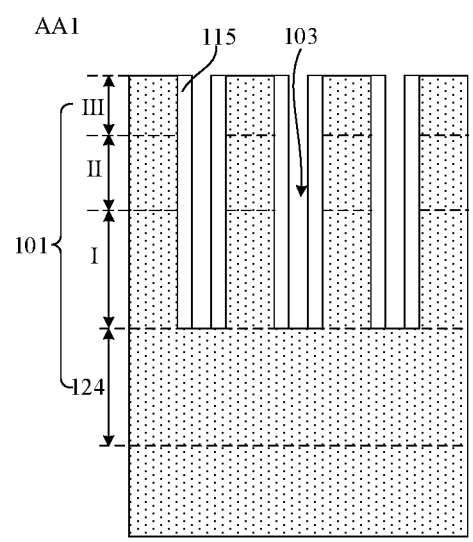
Figure 16:
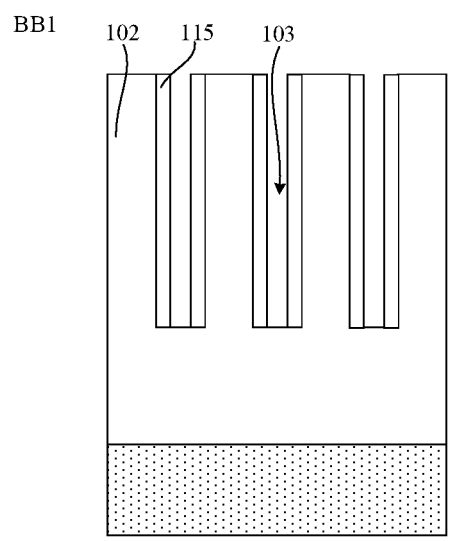

In some other embodiments, referring to FIG. 10 to FIG. 12, after the substrate 100 (referring to FIG. 1) is provided, and before the initial sacrificial film 105 is formed, the top surface of the given semiconductor layer 101 away from the given initial bit line 124 and the top surface of the isolation layer 102 away from the given initial bit line 124 are both exposed outside. Subsequently, the given initial bit line 124 is subjected to the first metallization treatment, and the second doped region III is also subjected to the second metallization treatment.

When the initial sacrificial film 105 is formed on the entire inner wall of the given trench 103, the initial sacrificial film 105 is further positioned on the top surface of the given semiconductor layer 101 away from the given initial bit line 124, the top surface of the isolation layer 102 away from the given initial bit line 124, and the bottom surface of the given trench 103.

In the above two embodiments, a material of the initial sacrificial film 105 may be silicon oxide, silicon oxynitride, or silicon nitride. In addition, the material of the initial sacrificial film 105 may be the same as the material of the isolation layer 102, such that the initial sacrificial film 105 positioned on the inner wall of the given trench 103 in the second region b and the isolation layer 102 of the second thickness may be removed together by means of an etching process subsequently. Thus, voids surrounding the side wall of the channel region II are formed, which facilitates subsequent fabrication of the gate electrode layer. Both the material of the initial sacrificial film 105 and the material of the isolation layer 102 may be silicon oxide.

In other embodiments, the material of the initial sacrificial film may also be different from the material of the isolation layer, as long as the material of the initial sacrificial film and the material of the isolation layer are both materials with good insulating effects. Next, the initial sacrificial film on the inner wall of the trench in the second region and the isolation layer of the second thickness may be removed in steps.

In the above two embodiments, referring to FIG. 6 to FIG. 9, FIG. 13, and FIG. 14, or referring to FIG. 10 to FIG. 12, FIG. 15, and FIG. 16, a sacrificial film 115 is formed, where the sacrificial film 115 is positioned on the entire inner wall of the given trench 103.

The initial sacrificial film 105 is subjected to a maskless dry etching process until the substrate 100 at the bottom of the given trench 103 (referring to FIG. 1) is exposed. Within the same etching time, different regions of the initial sacrificial film 105 is etched by means of the etching process at the same thickness, thereby forming the sacrificial film 115.

Figure 17:
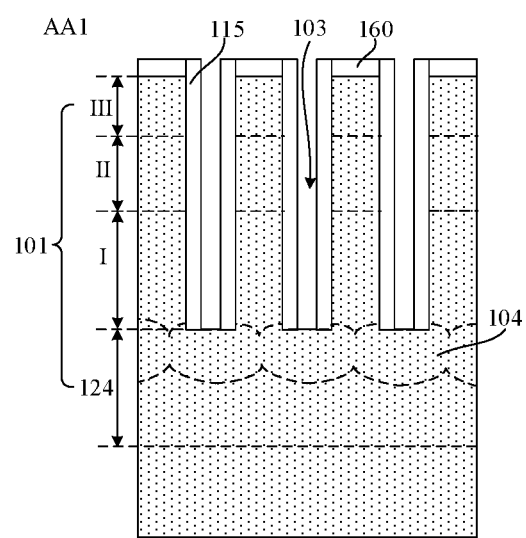
Figure 18:
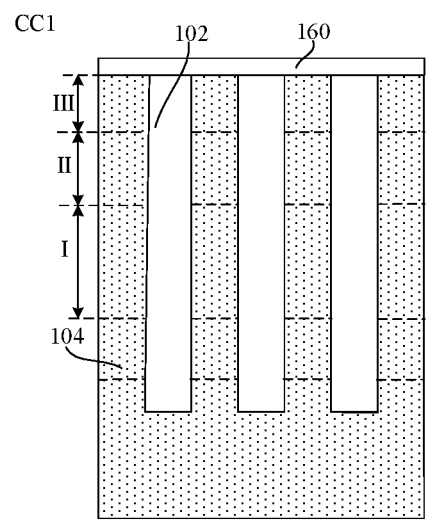
Figure 19:
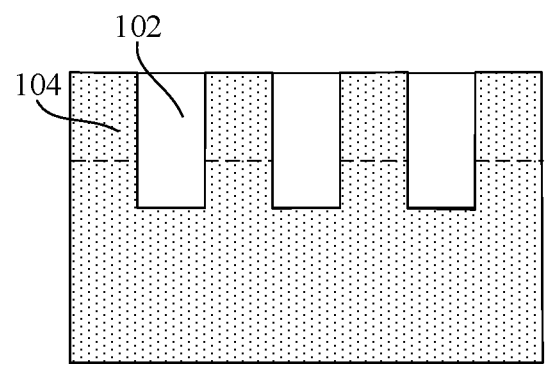

In some embodiments, referring to FIG. 17 to FIG. 19, when the first protective layer 160 is formed on the top surface of the given semiconductor layer 101 away from the given initial bit line 124 and the top surface of the isolation layer 102 away from the given initial bit line 124, and before the insulating layer 126 is formed, the fabrication method may further include: performing first metallization treatment on the given semiconductor layer 101 (i.e., the given initial bit line 124) at the bottom of the given trench 103, to convert a portion of a thickness of the given semiconductor layer 101 into the bit line 104, where the bit line 104 extends in the first direction X (referring to FIG. 1), and a material of the bit line 104 is a metal semiconductor compound.

The first metallization treatment includes: forming a metal layer (not shown in the figure) on a surface jointly constituted by the sacrificial film 115 and the first protective layer 160, the metal layer being further positioned at the bottom of the given trench 103; performing annealing treatment such that the metal layer reacts with the given semiconductor layer 101 to form the bit line 104; and removing a remaining portion of the unreacted metal layer.

It should be noted that in some embodiments, a material of a region of the initial bit line directly under the first doped region is a semiconductor material, and a material of a portion of a region of the initial bit line not covered by the first doped region is a metal semiconductor compound. It is to be understood that with continuous reduction of device sizes or adjustment of fabrication process parameters, the material of a portion of the region of the initial bit line directly under the first doped region is a semiconductor material, and a material of a remaining region of the initial bit line directly under the first doped region may also be a metal semiconductor compound. The position of the "remaining region" herein is positioned at a periphery of a "portion of the region".

For example, referring to FIG. 17 to FIG. 19, a plurality of metal semiconductor compounds in the given semiconductor layer 101 are connected to one another to form the bit line 104, where the bit line 104 includes the first doped region I partially metallized and the given initial bit line 124 partially metallized. That is, the material of the entire bit line 104 is a metal semiconductor compound. Or, referring to FIG. 20, the plurality of metal semiconductor compounds in the given semiconductor layer 101 are spaced from one another, and the bit line 104 includes the first doped region I partially metallized, the given initial bit line 124 partially metallized, and the given initial bit line 124 unmetallized between adjacent two of the plurality of metal semiconductor compounds. That is, the material of the bit line 104 is a mixed material of the metal semiconductor compound and the semiconductor material.

Figure 20:
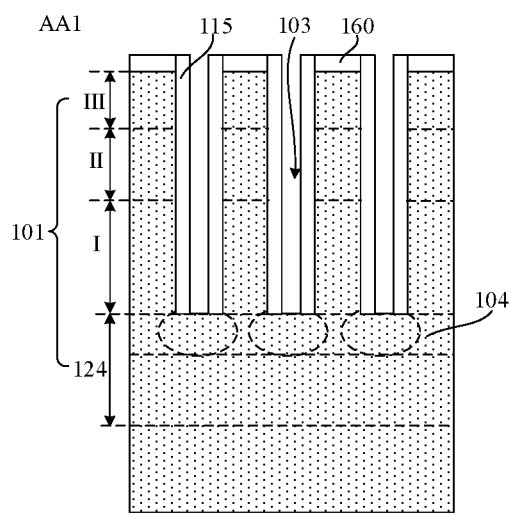

It should be noted that a region of the given semiconductor layer 101 defined by a dotted frame similar to an ellipse in FIG. 17 and FIG. 20 is the metal semiconductor compound, and in practical applications, a size of a contact region between adjacent two of the plurality of metal semiconductor compounds is not limited. In other embodiments, the initial bit line of the full thickness may be converted into a bit line.

Figure 21:
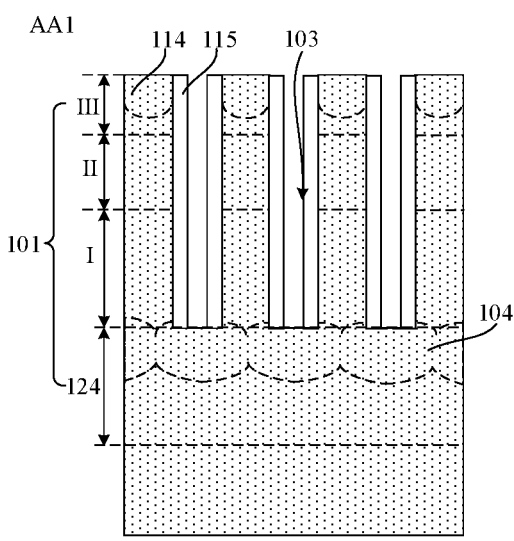
Figure 22:
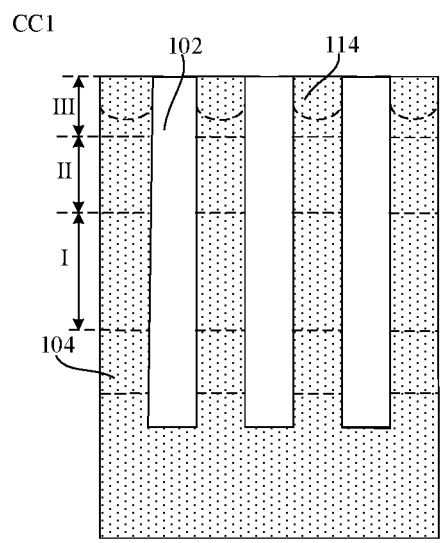

In some other embodiments, referring to FIG. 21 and FIG. 22, when the top surface of the given semiconductor layer 101 away from the given initial bit line 124 and the top surface of the isolation layer 102 away from the given initial bit line 124 are both exposed outside, and before the insulating layer 126 is formed, the fabrication method may further include: performing second metallization treatment on the given semiconductor layer 101 (i.e., the second doped region III) corresponding to the given trench 103 in the third region c (referring to FIG. 1). It may be understood that if the second gate electrode layer subsequently formed is used as a reference, the second metallization treatment is performed on the given semiconductor layer 101 above the top surface of the second gate electrode layer to form a metal silicide layer 114. A material of the metal silicide layer 114 is also the metal semiconductor compound, and the metal silicide layer 114 is a portion of the second doped region III.

It should be noted that a region of the second doped region III defined by a dotted frame similar to an ellipse in FIG. 21 and FIG. 22 is a metal semiconductor compound.

The first metallization treatment and the second metallization treatment may be performed in the same process step. That is, a metal layer (not shown in the figure) is formed on a surface jointly constituted by the sacrificial film 115 and the given semiconductor layer 101. That is, the metal layer is positioned at the bottom of the given trench 103 and a top surface of the second doped region III. Annealing treatment is performed such that the metal layer reacts with the given semiconductor layer 101 to form the bit line 104 and the metal silicide layer 114. A remaining portion of the unreacted metal layer is removed. In other embodiments, the first metallization and the second metallization may also be performed in steps.

In the above embodiments, by taking an example where the material of the semiconductor layer 101 is silicon, the material of the metal layer includes at least one of cobalt, nickel, molybdenum, titanium, tungsten, tantalum, or platinum, and the metal semiconductor compound includes at least one of cobalt silicide, nickel silicide, molybdenum silicide, titanium silicide, tungsten silicide, tantalum silicide, or platinum silicide. The metal semiconductor compound has a relatively lower resistivity compared with the unmetallized semiconductor material, so the resistivity of the bit line 104 is lower than that of the unmetallized semiconductor layer 101. Thus, it is beneficial to reduce the resistance of the bit line 104 and the contact resistance between the bit line 104 and the first doped region I, and further improve the electrical properties of the semiconductor structure.

In addition, when another conductive structure such as a capacitive contact structure (not shown in the figure) is subsequently formed on the metal silicide layer 114, the metal silicide layer 114 and the capacitive contact structure form ohmic contact, to prevent direct contact between the capacitive contact structure and the semiconductor material from forming a Schottky barrier contact. The ohmic contact is beneficial to reduce the contact resistance between the second doped region III and the capacitive contact structure, thereby reducing the energy consumption of the semiconductor structure during operation, and improving an RC delay effect to improve the electrical properties of the semiconductor structure.

Figure 23:
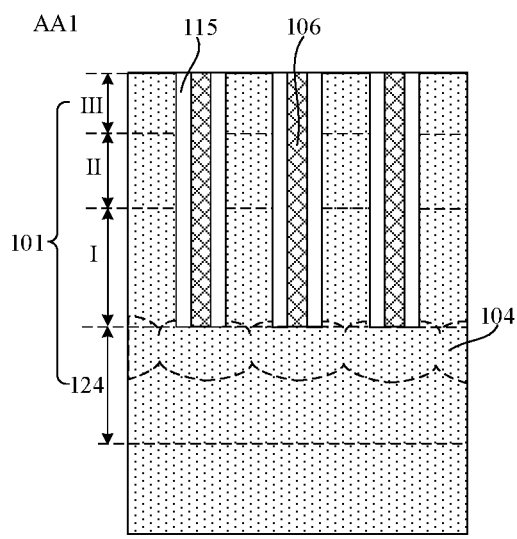
Figure 24:
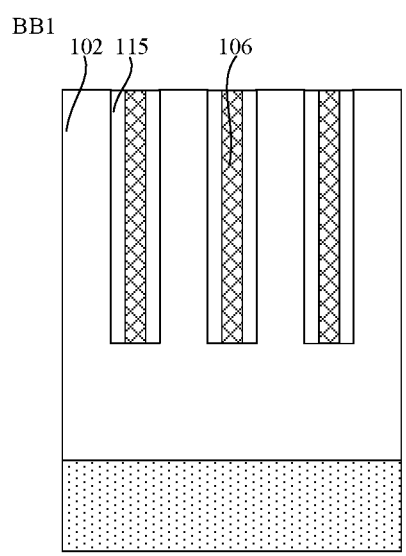
Figure 25:
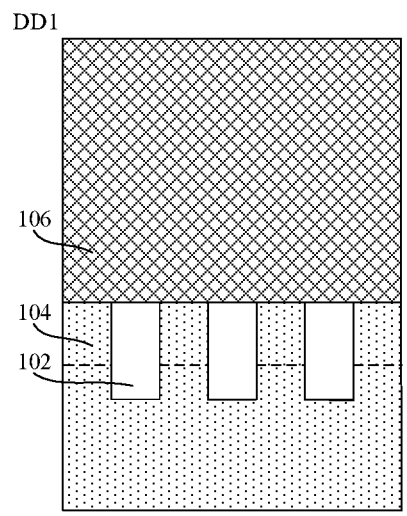
Figure 26:
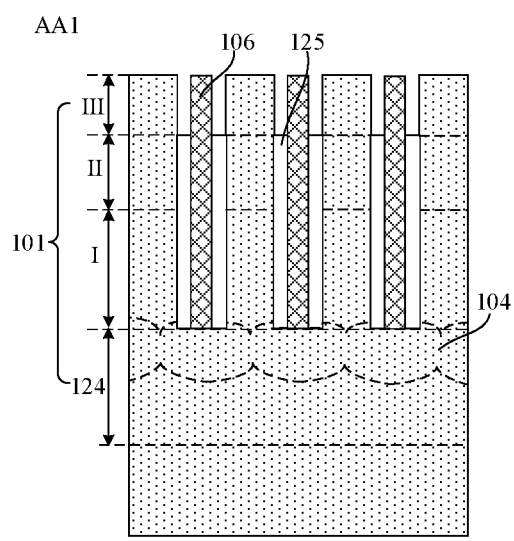
Figure 27:
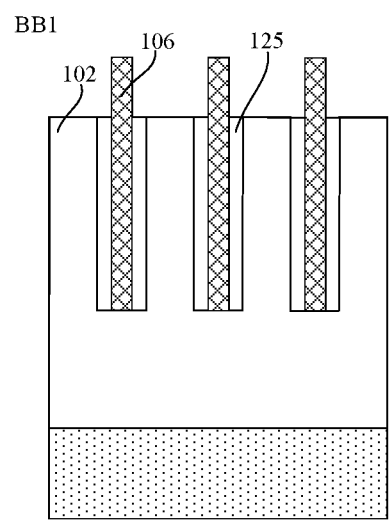
Figure 28:
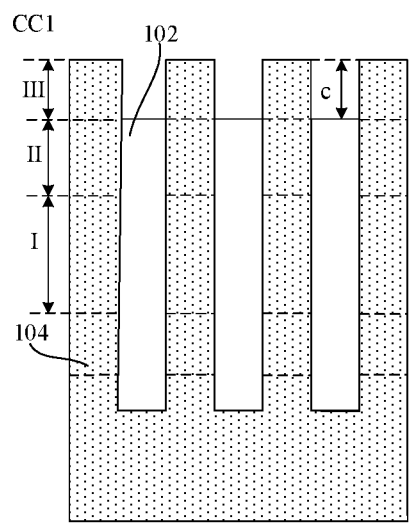

Referring to FIG. 23 to FIG. 25, a first insulating layer 106 filling up the given trench 103 is formed on the sacrificial film 115.

In some embodiments, referring to FIG. 17 to FIG. 19 and FIG. 23 to FIG. 25, when the first protective layer 160 is formed on the top surface of the given semiconductor layer 101 away from the given initial bit line 124 and the top surface of the isolation layer 102 away from the given initial bit line 124, the first insulating layer 106 may be formed by means of the following process steps: performing a deposition process to form a first insulating film covering the top surface of the first protective layer 160 and the top surface of the sacrificial film 115 and filling up the given trench 103; and performing chemical mechanical planarization on the first insulating film, the first protective layer 160, and the sacrificial film 115 until the top surface of the second doped region III is exposed, a remaining portion of the first insulating film being used as the first insulating layer 106.

In other embodiments, referring to FIG. 21 to FIG. 25, when the top surface of the given semiconductor layer 101 away from the given initial bit line 124 and the top surface of the isolation layer 102 away from the given initial bit line 124 are both exposed outside, the first insulating layer 106 may be formed by means of the following process steps: performing a deposition process to form the top surface of the second doped region III and a first insulating film filling up the given trench 103; and performing chemical mechanical planarization on the first insulating film until the top surface of the second doped region III is exposed, a remaining portion of the first insulating film being used as the first insulating layer 106.

In the above embodiments, the material of the first insulating film may be silicon oxide, silicon nitride, or silicon oxynitride. In addition, the material of the sacrificial film 115 may be different from the material of the first insulating film, such that a portion of the sacrificial film 115 is etched by using the first insulating layer 106 as a mask subsequently. For example, the material of the sacrificial film 115 is silicon oxide, and the material of the first insulating layer 106 is silicon nitride.

Referring to FIG. 23 to FIG. 25 and FIG. 26 to FIG. 28, the sacrificial film 115 positioned on the inner wall of the given trench 103 in the third region c is removed, and a remaining portion of the sacrificial film 115 is used as the sacrificial layer 125. That is, the sacrificial layer 125 exposes a portion of the side wall of the second doped region III of the given semiconductor layer 101.

While removing the sacrificial film 115 on the inner wall of the given trench 103 in the third region c, the isolation layer 102 of the second thickness is also removed, and the remaining portion of the isolation layer 102 exposes a portion of the side wall of the given semiconductor layer 101. It should be noted that in the direction Z (referring to FIG. 1) perpendicular to the surface of the substrate 100 (referring to FIG. 1), the second thickness is a height of the third region c, and the remaining portion of the isolation layer 102 exposes a portion of the side wall of the second doped region III, and the sacrificial layer 125 and the remaining portion of the isolation layer 102 jointly expose the entire side wall of the second doped region III. In some embodiments, in the direction Z, the height of the second doped region III is 30 nm to 50 nm.

The sacrificial film 115 on the inner wall of the given trench 103 in the third region c is etched and removed by a wet etching process, and the wet etching process has an equal etching rate for the isolation layer 102 and the sacrificial film 115. In this way, it is beneficial to expose the entire side wall of the second doped region III.

Figure 29:
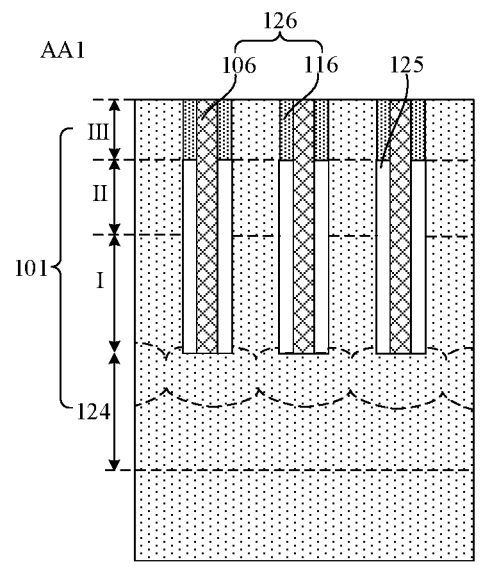
Figure 30:
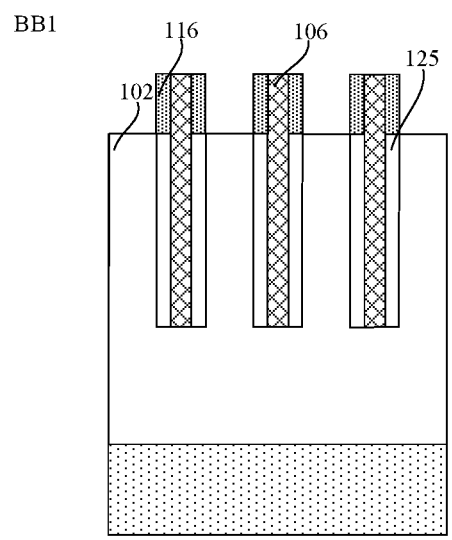
Figure 31:
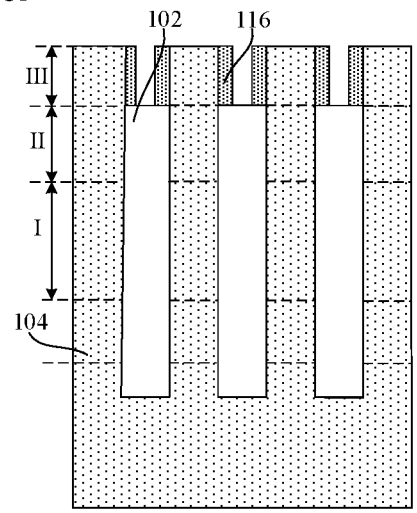

Referring to FIG. 29 to FIG. 31, a second insulating layer 116 is formed on the inner wall of the given trench 103 in the third region c (referring to FIG. 28), and the second insulating layer 116 is further positioned on the side wall of the first insulating layer 106, where the second insulating layer 116 and the first insulating layer 106 are used as the insulating layer 126.

The second insulating layer 116 surrounds the entire side wall of the second doped region III, the second insulating layer 116 surrounds a through hole, the isolation layer 102 is exposed at a bottom of the through hole, and the material of the second insulating layer 116 is different from the material of the isolation layer 102. In addition, the second insulating layer 116 also covers the top surface of the sacrificial layer 125 and a portion of the top surface of the isolation layer 102 while surrounding the side wall of the second doped region III, and a portion of the top surface of the isolation layer 102 is exposed by the through hole.

Figure 32:
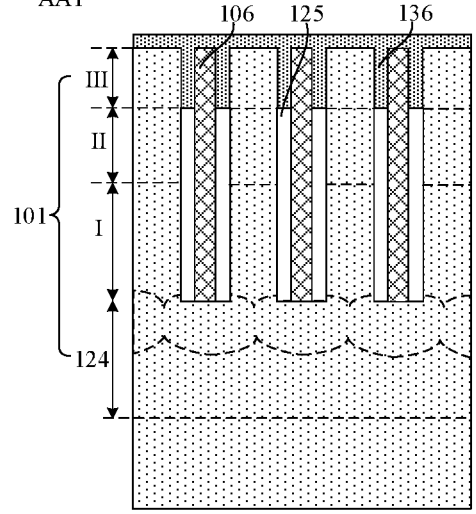
Figure 33:
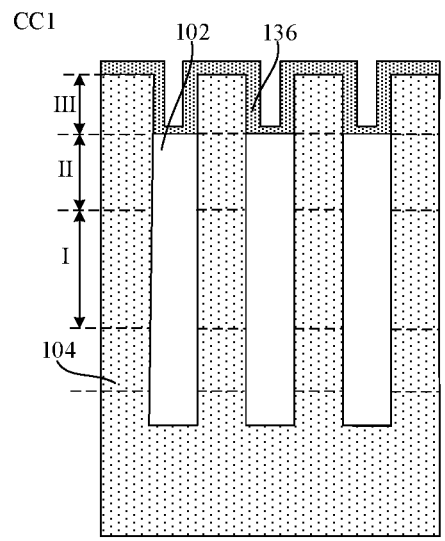
Figure 34:
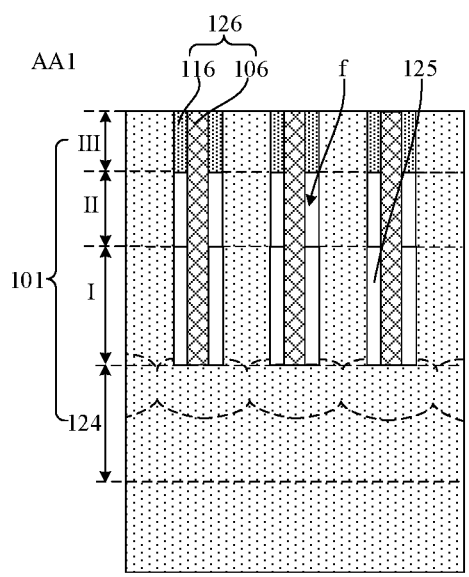
Figure 35:
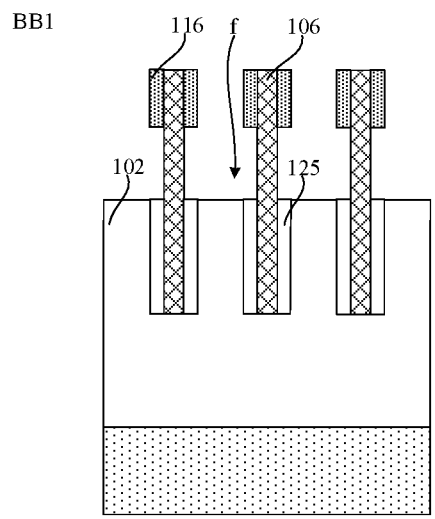
Figure 36:
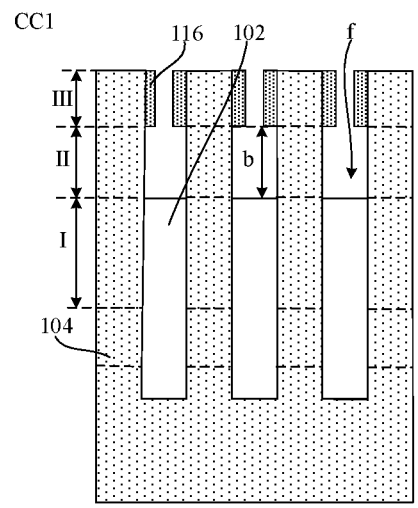

In some embodiments, referring to FIG. 32 and FIG. 33, the forming the second insulating layer 116 includes: forming an insulating film 136, where insulating film 136 fills up a region between the inner wall of the given trench 103 in the third region c (referring to FIG. 28) and the first insulating layer 106, the insulating film 136 is positioned on the top surface of the remaining portion of the isolation layer 102 and the exposed side wall of the given semiconductor layer 101, and the insulating film 136 is further positioned on the top surface of the given semiconductor layer 101; and etching back the insulating film 136 to remove the insulating film 136 above the upper surface of the given semiconductor layer 101 and further remove at least a portion of the insulating film 136 on the top surface of the isolation layer 102, the remaining portion of the insulating film 136 being used as the second insulating layer 116. The insulating film 136 may be etched by means of a maskless dry etching process. Within the same etching time, different regions of the insulating film 136 is etched by means of the etching process at the same thickness, thereby forming the second insulating layer 116 surrounding the entire side wall of the second doped region III.

Referring to FIG. 29 to FIG. 31 and FIG. 34 to FIG. 36, the sacrificial layer 125 in the second region b is removed, and the isolation layer 102 of the first thickness is removed to form voids f surrounding the given semiconductor layer 101, and the voids f expose a portion of the side wall of the given semiconductor layer.

In the direction Z (referring to FIG. 1), the first thickness is the height of the second region b. That is, the sacrificial layer 125 and the isolation layer 102 surrounding the entire side wall of the channel region II are removed, the formed voids f expose the entire side wall of the channel region II, and the remaining portions of the sacrificial layer 125 and the isolation layer 102 surround the side wall of the first doped region I. Because the second insulating layer 116 exposes a portion of the top surface of the isolation layer 102, and the material of the insulating layer 126 is different from the material of the sacrificial layer 125 or the material of the isolation layer 102, an etching solution may be injected into the second insulating layer 116 where the isolation layer 102 is exposed, and the sacrificial layer 125 in the second region b and the isolation layer 102 of the first thickness are removed by means of the wet etching process.

In addition, the first insulating layer 106 and the second insulating layer 116 jointly form a support framework, where the support framework is in contact with the second doped region III, and a portion of the support framework is embedded into the sacrificial layer 125. During the wet etching process, in one aspect, the support framework plays a role of supporting and fixing the given semiconductor layer 101, such that when the etching solution flows and thus a pressing force is exerted on the given semiconductor layer 101, it is beneficial to prevent the given semiconductor layer 101 from being inclined or offset under extrusion, thereby improving stability of the semiconductor structure. In another aspect, the support framework wraps around the side wall of the second doped region III, which is beneficial to prevent the etching solution from causing damage to the second doped region III.

Figure 37:
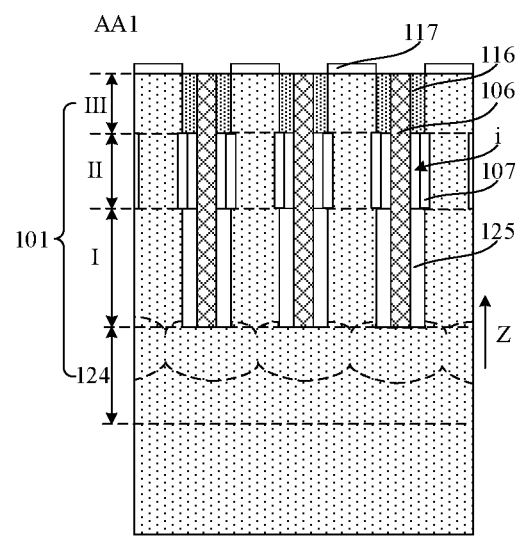
Figure 38:
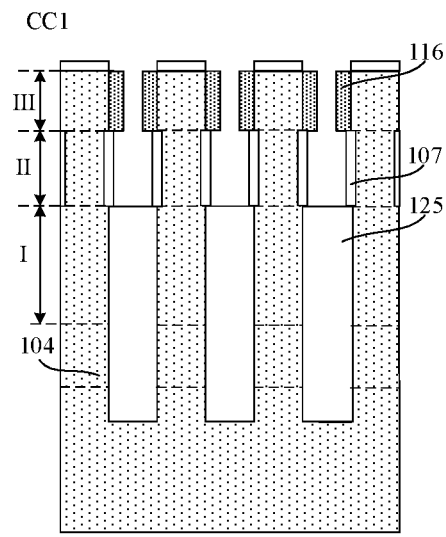

Referring to FIG. 37 and FIG. 38, a gate dielectric layer 107 is formed on the exposed side wall of the given semiconductor layer 101.

In some embodiments, because the material of the given semiconductor layer 101 is silicon, the forming the gate dielectric layer 107 includes: thermally oxidizing the exposed side wall of the channel region II to form the gate dielectric layer 107, where the gate dielectric layer 107 covers a surface of the side wall of the remaining portion of the channel region II. A material of the gate dielectric layer 107 is silicon oxide. In other embodiments, the gate dielectric layer covering a surface of the side wall of the channel region may also be formed by means of the deposition process.

Because the exposed side wall of the channel region II is thermally oxidized, a portion of the channel region II is converted into the gate dielectric layer 107, such that an orthographic projection of the channel region II on the substrate 100 (referring to FIG. 1) is less than that of the second doped region III on the substrate 100 and is less than that of the first doped region I on the substrate 100, which is beneficial to form the channel region II having a smaller cross-sectional area in a cross section perpendicular to the direction Z (referring to FIG. 1) under the premise of not using the etching process, thereby facilitating improving capability of the subsequently formed gate electrode layer in control of the channel region II, and thus making it easier to control the turn-on or turn-off of the GAA transistor. In some embodiments, in the direction Z, the height of the channel region II may be 30 nm to 50 nm.

Moreover, the orthographic projection of a periphery of the gate dielectric layer 107 on the substrate 100 is smaller than that of a periphery of the second insulating layer 116 on the substrate 100. That is, an outer wall of the gate dielectric layer 107 away from the given semiconductor layer 101 is closer to the given semiconductor layer 101 than an outer wall of the second insulating layer 116 away from the given semiconductor layer 101, thereby ensuring that there is an interval I between the gate dielectric layer 107 and the first insulating layer 106, such that a subsequent gate electrode layer can surround the gate dielectric layer 107 positioned on the side wall of the channel region II. In addition, the outer wall of the gate dielectric layer 107 away from the given semiconductor layer 101 may also be closer to the given semiconductor layer 101 than the outer wall of the isolation layer 102 away from the given semiconductor layer 101.

In addition, because the top surface of the second doped region III is exposed outside, during the thermal oxidation, a portion of the second doped region III close to the top surface may be converted into the insulating material layer 117. In some embodiments, the insulating material layer on the top surface of the remaining portion of the second doped region may be removed in subsequent process steps. In some other embodiments, the insulating material layer on the top surface of the remaining portion of the second doped region may be removed after the thermal oxidation.

Figure 39:
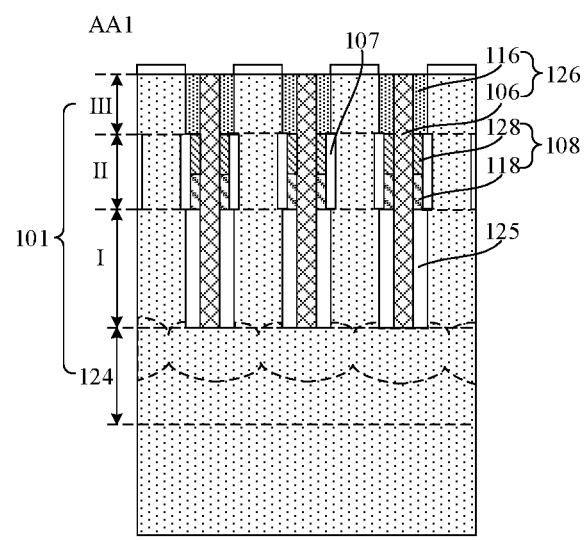
Figure 40:
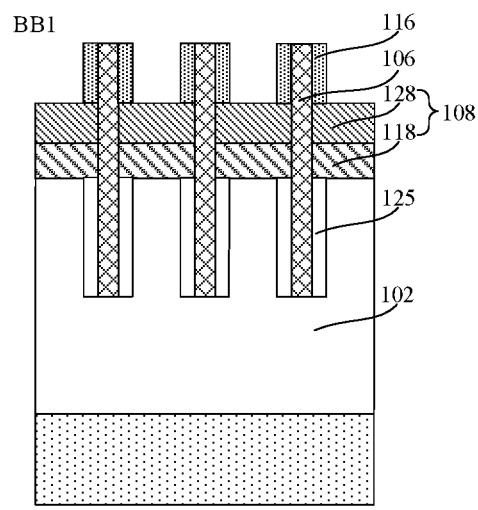
Figure 41:
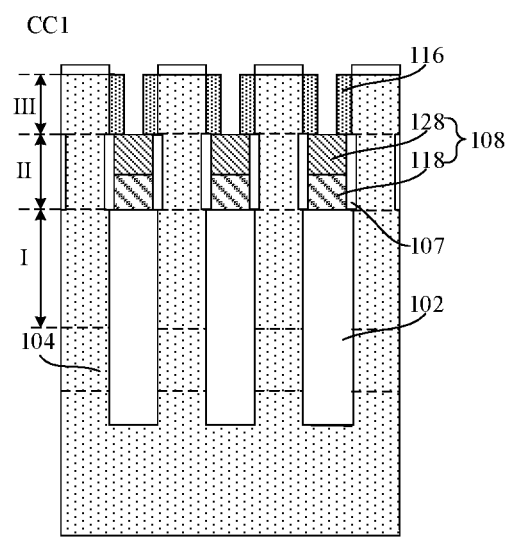

Referring to FIG. 39 to FIG. 41, a first gate electrode layer 118 is formed on a portion of the gate dielectric layer 107, where the first gate electrode layer 118 is also positioned on the top surface of the remaining portion of the isolation layer 102. A second gate electrode layer 128 is formed on the remaining portion of the gate dielectric layer 107, where a work function value of the second gate electrode layer 128 is different from that of the first gate electrode layer 118, and the first gate electrode layer 118 and the second gate electrode layer 128 are stacked in a direction directing from the first region a (referring to FIG. 1) to the third region c (referring to FIG. 1).

The forming the first gate electrode layer 118 may include: forming an initial gate electrode layer, where the initial gate electrode layer fills up an interval surrounded by the gate dielectric layer 107 and the insulating layer 126. In some embodiments, the initial gate electrode layer is positioned between the gate dielectric layer 107 and the first insulating layer 106, and is positioned between the gate dielectric layers 107 on the side walls of two adjacent of channel regions II on two adjacent bit lines 104. The initial gate electrode layer corresponding to the third region c and a portion of the second region b (referring to FIG. 1) are removed, and the remaining portion of the initial gate electrode layer is used as the first gate electrode layer 118. The initial gate electrode layer may be formed by means of the deposition process, and the material of the initial gate electrode layer includes at least one of polysilicon, titanium nitride, titanium aluminide, tantalum nitride, tantalum, cobalt, aluminum, lanthanum, copper, or tungsten.

The initial gate electrode layer fills up the interval surrounded by the gate dielectric layer 107 and the insulating layer 126 in self-alignment, which is conducive to form the first gate electrode layer 118 having a precise size in self-alignment, without designing the size of the first gate electrode layer 118 by means of the etching process, and thus it is beneficial to simplify steps of forming the first gate electrode layer 118. Moreover, by adjusting the size of the interval, a small-sized first gate electrode layer 118 may be obtained.

In addition, the step of forming the second gate electrode layer 128 is the same as the step of forming the first gate electrode layer 118, and thus details thereof are not to be described herein again. The second gate electrode layer 128 and the first gate electrode layer 118 jointly constitute the gate electrode layer 108.

Because the work function value of the second gate electrode layer 128 is different from that of the first gate electrode layer 118, according to the embodiments of the present disclosure, the work function value of the gate electrode layer 108 is reduced by adjusting the work function value of the second gate electrode layer 128 and the work function value of the first gate electrode layer 118 as well as the size ratio of the first gate electrode layer 118 with respect to the second gate electrode layer 128, to reduce the difference between the work function value of the gate electrode layer 108 and the work function value of the given semiconductor layer 101. In one aspect, it is beneficial to reduce the lateral electric field at the corresponding part of the gate electrode layer 108 and the given semiconductor layer 101, and reduce the GIDL, thereby helping to increase the turn-on/turn-off ratio of the channel region II, to improve the sensitivity of controlling the turn-on/turn-off of the channel region II. In another aspect, it is beneficial to enable the gate electrode layer 108 to be suitable for different types of transistors by adjusting related parameters of the first gate electrode layer 118 and the second gate electrode layer 128 while lowering the threshold voltage of the transistor.

Figure 42:
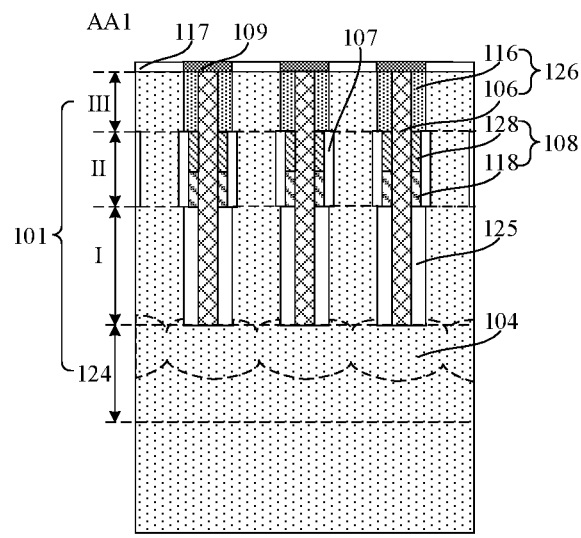

Referring to FIG. 42, after the gate electrode layer 108 is formed, a first dielectric layer 109 is also formed, where the first dielectric layer 109 fills up the gap surrounded by the second insulating layer 116.

The first dielectric layer 109 may be formed by means of the following process steps: performing a deposition process to form top surface of the insulating material layer 117 positioned on the top surface of the second doped region III and a dielectric film filling up the gap surrounded by the second insulating layer 116; and performing chemical mechanical planarization on the dielectric film until the top surface of the insulating material layer 117 is exposed, a remaining portion of the dielectric film being used as the first dielectric layer 109. A material of the dielectric film may be silicon nitride. In other embodiments, chemical mechanical planarization may also be performed on the dielectric film until the top surface of the second doped region is exposed. That is, the insulating material layer on the top surface of the second doped region is simultaneously removed, and the remaining portion of the dielectric film is used as the dielectric layer.

In some embodiments, a capacitive contact structure and a capacitive structure (not shown in the figure) are formed on the surface of the first dielectric layer away from the substrate 100 (referring to FIG. 1). In some embodiments, the insulating material layer 117 positioned on the top surface of the second doped region III is removed, the capacitive contact structure is formed on the top surface of the second doped region III, and a third insulating layer is formed between the capacitive contact structures positioned on the top surfaces of two adjacent second doped regions III, where the third insulating layer exposes the top surface of the capacitive contact structure away from the second doped region III. The capacitive structure is formed on the top surface of the capacitive contact structure away from the second doped region III.

In other embodiments, after the gate electrode layer is formed, the insulating layer may be removed by means of a wet etching process to form a through hole exposing the gate electrode layer and the sacrificial layer. A second dielectric layer filling up the through hole is formed by means of the deposition process. Because the second dielectric layer has an integrated structure, the second dielectric layer has a higher density and few internal defects, which is beneficial to enhance an isolation effect of the second dielectric layer on the adjacent semiconductor layers and the adjacent bit lines. In some embodiments, the material of the second dielectric layer may be the same as that of the first dielectric layer. In some examples, the material of the second dielectric layer and the material of the first dielectric layer are both silicon nitride.

In conclusion, in the direction directing from the first region a to the third region c, the first gate electrode layer 118 and the second gate electrode layer 128 are sequentially stacked on the gate dielectric layer 107, and the work function value of the second gate electrode layer 128 is different from the work function value of the first gate electrode layer 118. In this way, it is beneficial to reduce the difference between the work function value of the gate electrode layer 108 and the work function value of the given semiconductor layer 101 by adjusting the related parameters of the second gate electrode layer 128 and the first gate electrode layer 118. In one aspect, it is beneficial to reduce the GIDL to increase the turn-on/turn-off ratio of the channel region II. In another aspect, it is beneficial to enable the gate electrode layer 108 to be suitable for different types of transistors while lowering the threshold voltage of the transistor.

Another embodiment of the present disclosure further provides a method for fabricating a semiconductor structure. The method for fabricating a semiconductor structure is substantially the same as that in the forming embodiment, and main differences therebetween lie in that the process steps of removing the sacrificial layer in the second region and the isolation layer of the first thickness and forming the insulating layer are different. The method for fabricating a semiconductor structure provided by another embodiment of the present disclosure will be described in detail below with reference to the accompanying drawings. It should be noted that reference may be made to the detailed description of the foregoing embodiment for the same or corresponding parts as the previous embodiment, which is not described again herein.

FIG. 43 to FIG. 48 are schematic structural diagrams corresponding to various steps in a method for fabricating a semiconductor structure according to another embodiment of the present disclosure. It should be noted that to conveniently describe and illustrate the steps in the method for fabricating a semiconductor structure, FIG. 43 to FIG. 48 in this embodiment are schematic diagrams of partial structures of the semiconductor structure. One, two, or three of the schematic cross-sectional view in the first cross-sectional direction AA1, the schematic cross-sectional view in the second cross-sectional direction BB1, the schematic cross-sectional view in the third cross-sectional direction CC1, and the schematic cross-sectional view in the fourth cross-sectional direction DD1 in the structure are provided later as needed.

Figure 43:
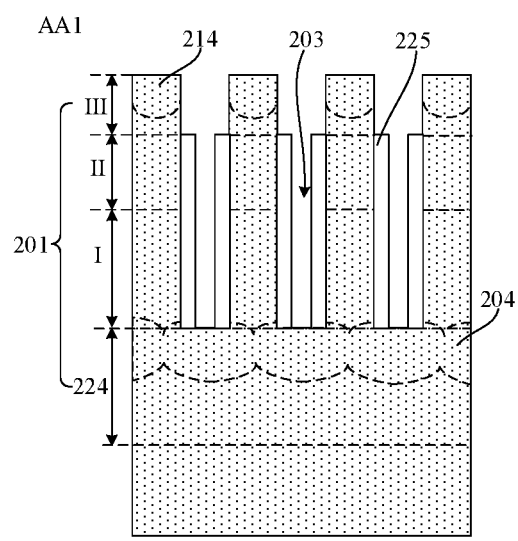
FIGS. 43 to 48 are schematic structural diagrams corresponding to steps of a method for fabricating a semiconductor structure according to another embodiment of the present disclosure.
Figure 44:
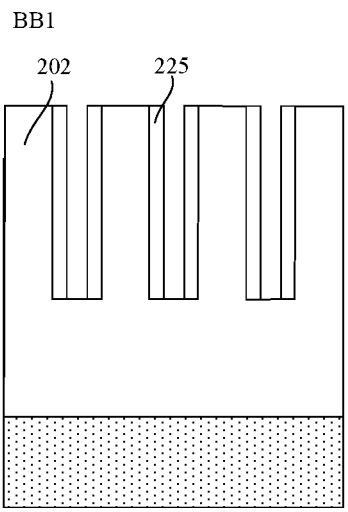
Figure 45:
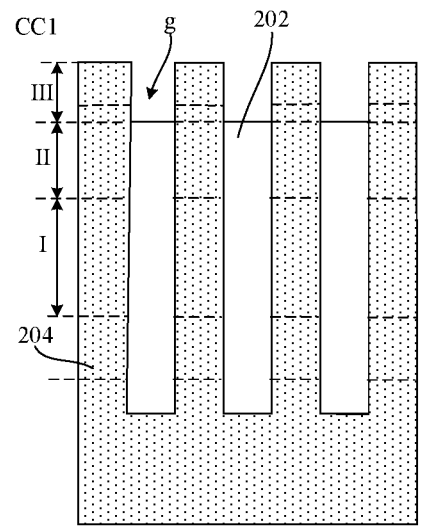

In the embodiments of the present disclosure, referring to FIG. 43 to FIG. 45, the step of forming the given semiconductor layer 201 and the initial bit line 224 on the substrate, the step of performing first metallization treatment on the initial bit line 224 to form the bit line 204, and the step of performing second metallization treatment on the second doped region III to form the metal silicide layer 214 are the same as those in the above embodiments, and thus details thereof are not described again herein.

Still referring to FIG. 43 to FIG. 45, before the insulating layer is formed, the forming the sacrificial layer 225 includes:

forming a sacrificial film, where the sacrificial film covers the entire inner wall of the trench 203 and is further positioned on the top surface of the given semiconductor layer 201. The step of forming the sacrificial film is the same as the step in the above embodiment, and thus details thereof are not described herein again.

The sacrificial film is etched back to remove the sacrificial film positioned at the bottom of the trench 203, the top surface of the given semiconductor layer 201, and the inner wall of the trench 203 in the third region c (referring to FIG. 1), and the remaining portion of the sacrificial film is used as the sacrificial layer 225.

Still referring to FIG. 43 to FIG. 45, during the etching back the sacrificial film, the isolation layer 202 of the second thickness is further removed, and an opening g is formed between adjacent semiconductor layers 201 and the remaining portion of the isolation layer 202. It should be noted that in the direction Z (referring to FIG. 1) perpendicular to the surface of the substrate, the second thickness is the height of the third region c, and the sacrificial layer 225 and the remaining portion of the isolation layer 202 jointly expose the entire side wall of the second doped region III.

Figure 46:
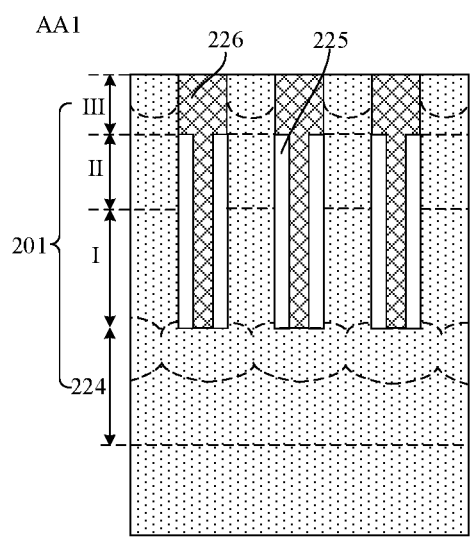
Figure 47:
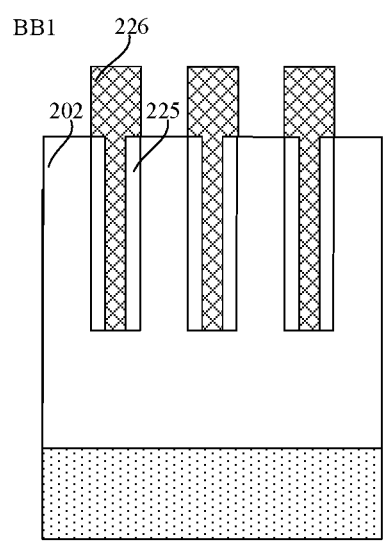
Figure 48:
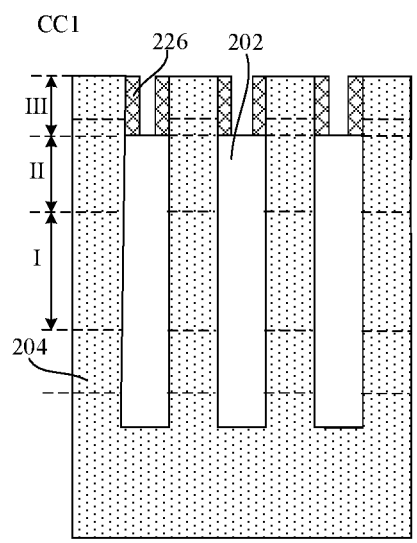

After the sacrificial layer 225 is formed, referring to FIG. 46 to FIG. 48, the forming the insulating layer 226 includes:

forming an insulating film filling up the trench 203 on the sacrificial layer 225, the insulating film further filling up the opening g (referring to FIG. 45); and removing at least a portion of the insulating film positioned in the opening g to expose at least a portion of the top surface of the remaining portion of the isolation layer 202, the remaining portion of the insulating film being used as the insulating layer 226. The step of forming the insulating film is the same as the step in the above embodiment, and thus details thereof are not described herein again.

Because the insulating layer 226 has an integrated structure, the insulating layer 226 has a higher density and few internal defects, which is beneficial to enhance the isolation effect of the insulating layer 226 on adjacent semiconductor layers 201, adjacent first gate electrode layers, and adjacent second gate electrodes.

It should be noted that in FIG. 47 and FIG. 48, an example is taken where the insulating layer 226 exposes a portion of the top surface of the isolation layer 202. However, in practical applications, the insulating layer may also expose the entire top surface of the isolation layer 202, and it is only required to ensure that the insulating layer is positioned between adjacent sacrificial layers in the trench for positioning when the first gate electrode layer and the second gate electrode layer are subsequently formed.

In the embodiments of the present disclosure, the step of removing the sacrificial layer 225 in the second region b and the isolation layer 202 of the first thickness, the step of forming the gate dielectric layer on the side wall of the exposed semiconductor layer 201, the step of forming the first gate electrode layer and the second gate electrode, and the step of forming the first dielectric layer are the same as those steps in the above embodiment, and thus details thereof are not described herein again.

In addition, a capacitive contact structure and a capacitive structure may also be formed on the top surface of the second doped region III. The step of forming the capacitive contact structure and the capacitive structure is the same as the step in the above embodiment, and thus details thereof are not described herein again.

In conclusion, in the direction directing from the first region a (referring to FIG. 1) to the third region c (referring to FIG. 1), the first gate electrode layer and the second gate electrode layer are sequentially stacked on the gate dielectric layer, and the work function value of the second gate electrode layer is different from the work function value of the first gate electrode layer. In this way, it is beneficial to reduce the difference between the work function value of the gate electrode layer and the work function value of the given semiconductor layer 201 by adjusting the related parameters of the second gate electrode layer and the first gate electrode layer. In one aspect, it is beneficial to reduce the GIDL to increase the turn-on/turn-off ratio of the channel region II. In another aspect, it is beneficial to enable the gate electrode layer to be suitable for different types of transistors while lowering the threshold voltage of the transistor, thereby helping to reduce the fabrication processes and the fabrication costs of the semiconductor structure.

Yet another embodiment of the present disclosure further provides a method for fabricating a semiconductor structure. The method for fabricating a semiconductor structure is substantially the same as that in the previous embodiment, and main differences therebetween lie in that the process steps of removing the sacrificial layer in the second region and the isolation layer of the first thickness and forming the gate dielectric layer are different. The method for fabricating a semiconductor structure provided by yet another embodiment of the present disclosure will be described in detail below with reference to the accompanying drawings. It should be noted that reference may be made to the detailed description of the foregoing embodiments for the same or corresponding parts as the previous embodiment, which is not described herein again.

FIGS. 49 to 54 are schematic structural diagrams corresponding to steps of a method for fabricating a semiconductor structure according to yet another embodiment of the present disclosure. It should be noted that to conveniently describe and clearly illustrate the steps in the method for fabricating a semiconductor structure, FIG. 49 to FIG. 54 in this embodiment are schematic diagrams of partial structures of the semiconductor structure. One, two, or three of the schematic cross-sectional view in the first cross-sectional direction AA1, the schematic cross-sectional view in the second cross-sectional direction BB1, the schematic cross-sectional view in the third cross-sectional direction CC1, and the schematic cross-sectional view in the fourth cross-sectional direction DD1 in the structure are provided later as needed.

Figure 49:
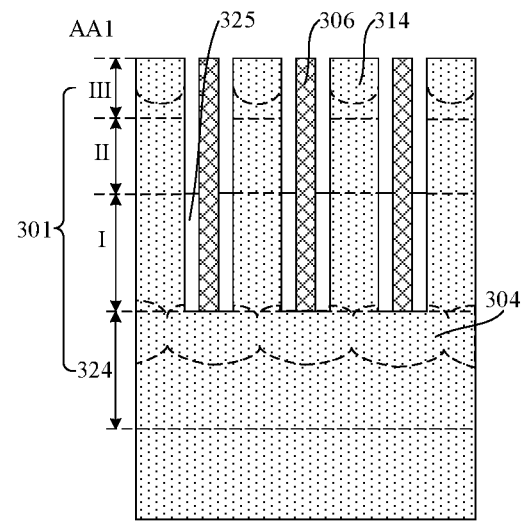
FIGS. 49 to 54 are schematic structural diagrams corresponding to steps of a method for fabricating a semiconductor structure according to yet another embodiment of the present disclosure.
Figure 50:
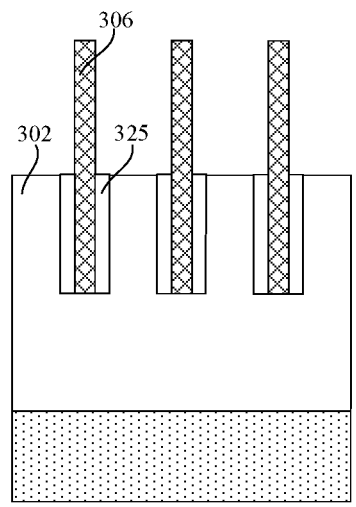
Figure 51:
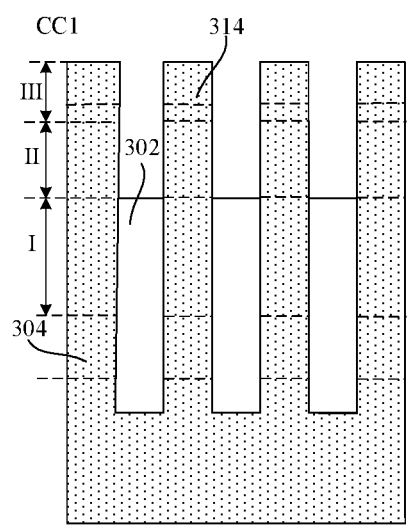

In the embodiments of the present disclosure, referring to FIG. 49 to FIG. 51, the step of forming the given semiconductor layer 301 and the initial bit line 324 on the substrate, the step of performing first metallization treatment on the initial bit line 324 to form the bit line 304, the step of performing second metallization treatment on the second doped region III to form the metal silicide layer 314, and the step of forming the first insulating layer 306 are the same as those steps in the above embodiments, and thus details thereof are not described herein again.

Still referring to FIG. 49 to FIG. 51, the etching back the sacrificial film further includes: removing the sacrificial layer 325 in the second region b (referring to FIG. 1), the remaining portion of the sacrificial layer 325 surrounding a portion of the side wall of the first doped region I.

While removing the sacrificial layer 325 in the second region b, the isolation layer 302 of the first thickness is further removed to expose the entire side wall of the channel region II and the entire side wall of the second doped region III. In the direction Z (referring to FIG. 1), the first thickness is the height of the second region b. That is, the sacrificial layer 325 and the isolation layer 302 surrounding the entire side wall of the channel region II are removed, and the remaining portion of the sacrificial layer 325 and the remaining portion of the isolation layer 302 surround the side wall of the first doped region I.

Figure 52:
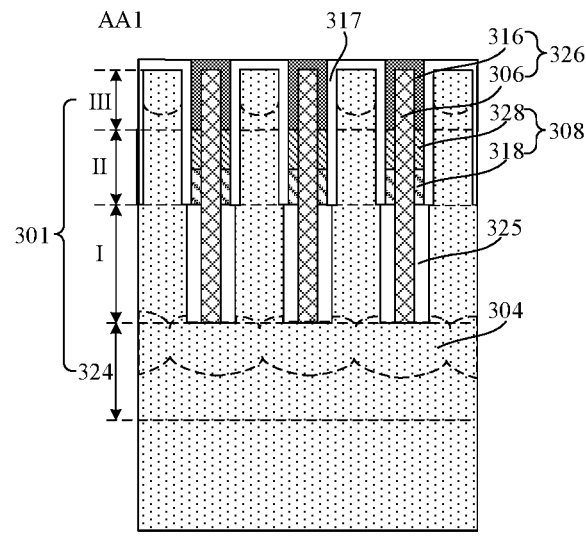
Figure 53:
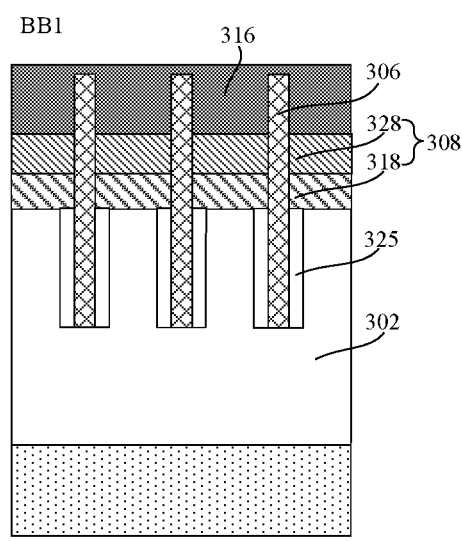
Figure 54:
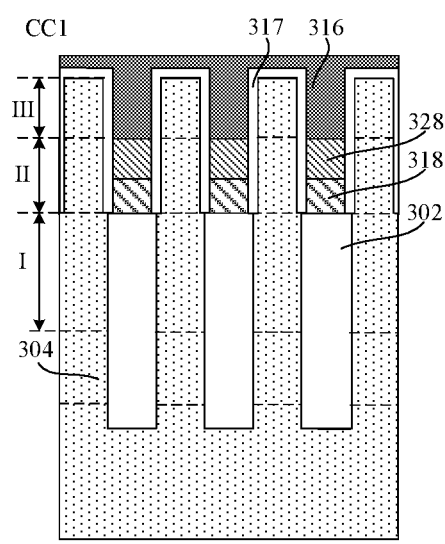

Referring to FIG. 52 to FIG. 54, the forming the gate dielectric layer includes: forming a third dielectric layer 317 at least on the inner wall of the trench in the second region b (referring to FIG. 1) and the third region c (referring to FIG. 1), where the third dielectric layer 317 on the inner wall of the trench in the second region b is used as the gate dielectric layer.

In some embodiments, because the material of the given semiconductor layer 301 is silicon, the forming the third dielectric layer 317 includes: thermally oxidizing the exposed side wall of the channel region II and the side wall and the top surface of the second doped region III to form a third dielectric layer 317, where the third dielectric layer 317 covers the remaining portion of the channel region II and the surface of the side wall of the remaining portion of the second doped region III. In other embodiments, the third dielectric layer covering the side wall of the channel region and the side wall and the top surface of the second doped region may also be formed by means of the deposition process.

Because the exposed side wall of the channel region II and the exposed side wall of the second doped region III are thermally oxidized, a portion region of the channel region II and a portion region of the second doped region III are converted into the third dielectric layer 317, such that the orthographic projection of the channel region II on the bit line 304 and the orthographic projection of the second doped region III on the bit line 304 are both smaller than the orthographic projection of the first doped region I on the bit line 304. Thus, the channel region II and the second doped region III having a smaller cross-sectional area in the section in the direction Z are formed under the premise of not using the etching process, which is beneficial to reduce the threshold voltage of the transistor formed by the given semiconductor layer 301, such that the transistor is turned on or off at a lower threshold voltage.

It should be noted that in some embodiments, the third dielectric layer on the top surface of the remaining portion of the second doped region may be removed in subsequent process steps. In some other embodiments, after the thermal oxidation is completed, the third dielectric layer on the top surface of the remaining portion of the second doped region is removed, and only the third dielectric layer covering the remaining portion of the channel region and the surface of the side wall of the remaining portion of the second doped region are remained.

Still referring to FIG. 52 to FIG. 54, the gate electrode layer 308 and the second insulating layer 316 are formed. The step of forming the gate electrode layer 308 and the second insulating layer 316 is the same as the step in the above embodiment, and the first insulating layer 306 and the second insulating layer 316 jointly constitute the insulating layer 326, and thus related details are not described herein again. In addition, a capacitive contact structure and a capacitive structure may also be formed on the top surface of the second doped region III. The step of forming the capacitive contact structure and the capacitive structure is the same as the step in the above embodiment, and thus details thereof are not described herein again.

In conclusion, in the direction directing from the first region a (referring to FIG. 1) to the third region c (referring to FIG. 1), the first gate electrode layer 318 and the second gate electrode layer 328 are sequentially stacked on the gate dielectric layer, and the work function value of the second gate electrode layer 328 is different from the work function value of the first gate electrode layer 318. In this way, it is beneficial to reduce the difference between the work function value of the gate electrode layer 308 and the work function value of the given semiconductor layer 301 by adjusting the related parameters of the second gate electrode layer 328 and the first gate electrode layer 318. In one aspect, it is beneficial to reduce the GIDL to increase the turn-on/turn-off ratio of the channel region II. In another aspect, it is beneficial to enable the gate electrode layer 308 to be suitable for different types of transistors while lowering the threshold voltage of the transistor, thereby helping to reduce the fabrication processes and the fabrication costs of the semiconductor structure.

Still another embodiment of the present disclosure further provides a semiconductor structure, which may be fabricated by means the method for fabricating a semiconductor structure provided in any one of the above embodiments.

In some embodiments, referring to FIG. 42, the semiconductor structure includes: a substrate 100 (referring to FIG. 1), a sacrificial layer 125; a gate dielectric layer 107, a first gate electrode layer 118, and a second gate electrode layer 128; and an insulating layer 126. The substrate 100 includes a plurality of semiconductor layers 101 arranged at intervals and an isolation layer 102 positioned between adjacent two of the plurality of semiconductor layers 101, each of the plurality of semiconductor layers 101 and the isolation layer 102 are internally provided with trenches 103, the plurality of semiconductor layers 101 extend in a first direction X (referring to FIG. 1), and the trenches 103 extend in a second direction Y (referring to FIG. 1), where the second direction Y is different from the first direction X. Each of the trenches 103 includes a first region a (referring to FIG. 1), a second region b (referring to FIG. 1) and a third region c (referring to FIG. 1) sequentially distributed in a direction directing from a bottom of the trench 103 to a top of the trench 103. The sacrificial layer 125 is positioned on an inner wall of the trench 103 in the first region a. The first gate electrode layer 118 and the second gate electrode layer 128 are both positioned on the gate dielectric layer 107, and are positioned in the trench 103 in the second region b and surround the given semiconductor layer 101. The first gate electrode layer 118 is further positioned on a top surface of the isolation layer 102, the second gate electrode layer 128 and the first gate electrode layer 118 are stacked in a direction directing from the first region a to the third region c, and a work function value of the second gate electrode layer 128 is different from a work function value of the first gate electrode layer 118. The insulating layer 126 is positioned in the trench 103 and is configured to isolate opposite two of the gate electrode layers 108 positioned in the same trench 103, and the insulating layer 126 also fills up the trench 103 in the third region c.

The insulating layer 126 may be jointly constituted by the first insulating layer 106 and the second insulating layer 116, where the first insulating layer 106 fills up the interval between adjacent two of the plurality of insulating layers 102, and the top surface of the first insulating layer 106 is not lower than the top surface of the second doped region III, the inner wall of the given trench 103 of the third region c of the second insulating layer 116, and the side wall of the first insulating layer 106. In some embodiments, the insulating layer 126 has an integrated structure, and the insulating layer 126 fills up the interval between adjacent two of the plurality of isolation layers 102 and the interval between adjacent two of the plurality of semiconductor layers 101, and the top surface of the insulating layer 126 is not lower than the top surface of the second doped region III.

Referring to FIG. 52 to FIG. 54, mutual relationships among the given semiconductor layer 301, the isolation layer 302, the sacrificial layer 325, the gate dielectric layer, the first gate electrode layer 318, the second gate electrode layer 328 and the insulating layer 326 in the semiconductor structure are the same as those in the above embodiments, and thus details thereof are not described herein again.

The semiconductor structure has a third dielectric layer 317, where the third dielectric layer 317 is positioned at least on the inner wall of the trench in the second region b (referring to FIG. 1) and the third region c (referring to FIG. 1), and the third dielectric layer 317 positioned on the inner wall of the trench in the second region b is used as the gate dielectric layer.

In the above two embodiments, the first gate electrode layer and the second gate electrode layer jointly constitute the gate electrode layer, and the top surface of the isolation layer directly under the first gate electrode layer is flush with the top surface of the sacrificial layer. In this way, in one aspect, it is beneficial to improve the insulating effect of the structure jointly constituted by the isolation layer and the sacrificial layer on the first doped region and adjacent bit lines. In another aspect, it is beneficial to improve the size accuracy of the gate electrode layer and improve the capability of the gate electrode layer in control of the channel region.

The semiconductor structure may further include: a bit line extending along the first direction X, where the bit line is positioned at the bottom of the trench and directly below the bottom of the adjacent trench, and a material of the bit line is a metal semiconductor compound. The metal semiconductor compound has relatively lower resistivity than the unmetallized semiconductor material. Therefore, the resistivity of the bit line is lower than that of the unmetallized semiconductor layer, thereby facilitating reducing the resistance of the bit line, reducing the contact resistance between the bit line and the first doped region, and thus further improving the electrical properties of the semiconductor structure. The metal semiconductor compound may be at least one of cobalt silicide, nickel silicide, molybdenum silicide, titanium silicide, tungsten silicide, tantalum silicide, or platinum silicide.

In addition, the semiconductor structure may further include a metal silicide layer positioned in the second doped region, the top surface of the metal silicide layer being the top surface of the second doped region that is not subjected to the second metallization treatment. Since when another conductive structure such as the capacitive contact structure will be subsequently formed on the metal silicide layer, the metal silicide layer and the capacitive contact structure form ohmic contact to avoid direct contact between the capacitive contact structure and the semiconductor material to form Schottky barrier contact. The ohmic contact is beneficial to reduce the contact resistance between the second doped region III and the capacitive contact structure, thereby reducing the energy consumption of the semiconductor structure during operation, and improving the RC delay effect to improve the electrical properties of the semiconductor structure.

The semiconductor structure may further include a capacitive contact structure and a capacitive structure. The capacitive contact structure is positioned on a surface jointly constituted by the first dielectric layer and the insulating layer, or on a surface jointly constituted by the third dielectric layer and the insulating layer; and the capacitive structure is positioned on a side of the capacitive contact structure away from the substrate.

In conclusion, the first gate electrode layer and the second gate electrode layer jointly constitute the gate electrode layer, and the work function value of the second gate electrode layer is different from the work function value of the first gate electrode layer. In this way, it is beneficial to reduce the difference between the work function value of the gate electrode layer and the work function value of the given semiconductor layer by adjusting the related parameters of the second gate electrode layer and the first gate electrode layer. In one aspect, it is beneficial to reduce the GIDL to increase the turn-on/turn-off ratio of the channel region II. In another aspect, it is beneficial to enable the gate electrode layer to be suitable for different types of transistors while lowering the threshold voltage of the transistor, thereby helping to reduce the fabrication processes and the fabrication costs of the semiconductor structure.

Those of ordinary skill in the art can understand that the above-mentioned embodiments are some embodiments for realizing the present disclosure, but in practical applications, various changes can be made to them in form and details without departing from the spirit and scope of the present disclosure. Any person skilled in the art can make their own changes and modifications without departing from the spirit and scope of the present disclosure. Therefore, the protection scope of the present disclosure shall be subject to the scope defined by the claims.

What is claimed is:

1. A method for fabricating a semiconductor structure, comprising:
   providing a substrate, the substrate comprising a plurality of semiconductor layers arranged at intervals and an isolation layer positioned between adjacent two of the plurality of semiconductor layers, a given one of the plurality of semiconductor layers and the isolation layer being internally provided with trenches, the plurality of semiconductor layers extending in a first direction, the trenches extending in a second direction and being arranged at intervals in the first direction, the second direction being different from the first direction, and each of the trenches comprising a first region, a second region and a third region sequentially distributed in a direction directing from a bottom of the trench to a top of the trench;
   forming a sacrificial layer on an inner wall of the trench in the first region and the second region;
   forming an insulating layer filling up the trench on a surface of the sacrificial layer, the insulating layer also exposing at least a portion of a surface of the isolation layer;
   removing the sacrificial layer in the second region, and removing the isolation layer of a first thickness to form voids surrounding the given semiconductor layer, the voids exposing a portion of a side wall of the given semiconductor layer;
   forming a gate dielectric layer on the exposed side wall of the given semiconductor layer;
   forming a first gate electrode layer on a portion of the gate dielectric layer, the first gate electrode layer being also positioned on a top surface of a remaining portion of the isolation layer; and
   forming a second gate electrode layer on a remaining portion of the gate dielectric layer, a work function value of the second gate electrode layer being different from a work function value of the first gate electrode layer, and the first gate electrode layer and the second gate electrode layer being stacked in a direction directing from the first region to the third region.

2. The fabrication method according to claim 1, wherein the forming the sacrificial layer and the insulating layer comprises:
   forming a sacrificial film, the sacrificial film being positioned on an entire inner wall of the trench;

forming a first insulating layer filling up the trench on the sacrificial film;

removing the sacrificial film positioned on the inner wall of the trench in the third region, a remaining portion of the sacrificial film being used as the sacrificial layer; and forming a second insulating layer on the inner wall of the trench in the third region, the second insulating layer being further positioned on a side wall of the first insulating layer, and the second insulating layer and the first insulating layer being used as the insulating layer.

3. The fabrication method according to claim 2, wherein the isolation layer of a second thickness is further removed while the sacrificial film on the inner wall of the trench in the third region is removed, and a remaining portion of the isolation layer exposes a portion of the side wall of the given semiconductor layer;

and in the formation of the second insulating layer, the second insulating layer is further positioned on the side wall of the given semiconductor layer exposed by the remaining portion of the isolation layer.

4. The fabrication method according to claim 3, wherein the sacrificial film on the inner wall of the trench in the third region is etched and removed by means of a wet etching process, the wet etching process having an equal etching rate for the isolation layer and the sacrificial film.

5. The fabrication method according to claim 2, wherein the forming the second insulating layer comprises: forming an insulating film, the insulating film filling up a region between the inner wall of the trench in the third region and the first insulating layer, the insulating film being positioned on a top surface of the remaining portion of the isolation layer and the exposed side wall of the given semiconductor layer, and the insulating film being further positioned on the top surface of the given semiconductor layer; and etching back the insulating film to remove the insulating film above the top surface of the given semiconductor layer and further remove at least a portion of the insulating film on the top surface of the isolation layer, a remaining portion of the insulating film being used as the second insulating layer.

6. The fabrication method according to claim 1, wherein the forming the sacrificial layer comprises:

forming a sacrificial film, the sacrificial film covering an entire inner wall of the trench and being further positioned on a top surface of the given semiconductor layer; and etching back the sacrificial film, and etching to remove the sacrificial film positioned at a bottom of the trench, the top surface of the given semiconductor layer, and the inner wall of the trench in the third region, a remaining portion of the sacrificial film being used as the sacrificial layer.

7. The fabrication method according to claim 6, wherein during the etching back the sacrificial film, the isolation layer of a second thickness is further removed, and an opening is defined between adjacent two of the plurality of semiconductor layers and the remaining portion of the isolation layer;

and the forming the insulating layer comprises:

forming an insulating film filling up the trench on the sacrificial layer, the insulating film further filling up the opening; and removing at least a portion of the insulating film positioned in the opening to expose at least a portion of the top surface of the remaining portion of the isolation layer, the remaining portion of the insulating film and the first insulating layer being used as the insulating layer.

8. The fabrication method according to claim 6, wherein the etching back the sacrificial film further comprises:

removing the sacrificial layer in the second region; and the forming a gate dielectric layer comprises: forming a dielectric layer at least on the inner wall of the trench in the second region and the third region, the dielectric layer on the inner wall of the trench in the second region being used as the gate dielectric layer.

9. The fabrication method according to claim 1, wherein before the insulating layer is formed, the fabrication method further comprises:

performing first metallization treatment on a given one of the plurality of semiconductor layers below the bottom of the trench, to convert the given semiconductor layer of a portion of thicknesses into a bit line, the bit line extending in the first direction, and a material of the bit line being a metal semiconductor compound.

10. The fabrication method according to claim 9, wherein the forming the sacrificial layer comprises: forming a sacrificial film on all inner walls of the trench; and the first metallization treatment comprises:

forming a metal layer on a surface of the sacrificial film, the metal layer being further positioned at the bottom of the trench;

performing annealing treatment such that the metal layer reacts with the given semiconductor layer to form the bit line; and removing a remaining portion of the unreacted metal layer.

11. The fabrication method according to claim 9, further comprising:

after the sacrificial layer is formed, performing second metallization treatment on a given one of the plurality of semiconductor layers above a top surface of the second gate electrode layer, to form a metal silicide layer.

12. The fabrication method according to claim 11, wherein the first metallization treatment and the second metallization treatment are performed in a same process step.

* * * * *